United States Patent
Narushima et al.

(10) Patent No.: US 10,233,562 B2
(45) Date of Patent: Mar. 19, 2019

(54) METHOD FOR PRODUCING SINGLE CRYSTAL, AND METHOD FOR PRODUCING SILICON WAFER

(71) Applicant: SUMCO TECHXIV CORPORATION, Nagasaki (JP)

(72) Inventors: Yasuhito Narushima, Tokyo (JP); Toshimichi Kubota, Tokyo (JP); Fukuo Ogawa, Tokyo (JP); Masayuki Uto, Tokyo (JP)

(73) Assignee: SUMCO TECHXIV CORPORATION, Nagasaki (JP)

( * ) Notice: Subject to any disclaimer, the term of this patent is extended or adjusted under 35 U.S.C. 154(b) by 0 days.

(21) Appl. No.: 14/785,756

(22) PCT Filed: Apr. 15, 2014

(86) PCT No.: PCT/JP2014/060721
§ 371 (c)(1),
(2) Date: Oct. 20, 2015

(87) PCT Pub. No.: WO2014/175120
PCT Pub. Date: Oct. 30, 2014

(65) Prior Publication Data
US 2016/0102418 A1    Apr. 14, 2016

(30) Foreign Application Priority Data

Apr. 24, 2013    (JP) .................................. 2013-091332

(51) Int. Cl.
*C30B 15/04*    (2006.01)
*C30B 15/20*    (2006.01)
(Continued)

(52) U.S. Cl.
CPC ............. *C30B 15/04* (2013.01); *B28D 5/0011* (2013.01); *C30B 15/14* (2013.01); *C30B 15/20* (2013.01);
(Continued)

(58) Field of Classification Search
CPC ....... C30B 15/14; C30B 29/06; C30B 15/206; C30B 15/04; C30B 15/20; C30B 33/00
See application file for complete search history.

(56) References Cited

U.S. PATENT DOCUMENTS 4,247,859 A * 1/1981 Rai-Choudhury .... H01L 27/092
257/352
5,935,326 A * 8/1999 Kotooka ................. C30B 15/14
117/217
(Continued)

FOREIGN PATENT DOCUMENTS

JP        07223893 A  *  8/1995  ............. C30B 15/00
JP     2006-052133 A     2/2006
(Continued)

OTHER PUBLICATIONS

European Patent Office, English computer translation of JP 07-223893 (2017).*
(Continued)

*Primary Examiner* — Matthew J Song
(74) *Attorney, Agent, or Firm* — Greenblum & Bernstein, P.L.C.

(57) ABSTRACT

A manufacturing method of a single crystal uses a single-crystal pull-up apparatus includes: adding the red phosphorus to the silicon melt so that a resistivity of the single crystal falls in a range from 0.7 mΩ·cm to 0.9 mΩ·cm; subjecting an evaluation silicon wafer obtained from the single crystal to a heat treatment in which the evaluation silicon wafer is heated at 1200 degrees C. for 30 seconds in a hydrogen
(Continued)

atmosphere; and pull-up the single crystal while appropriately controlling a period for a temperature of the single crystal to be in a range of 570±70 degrees C. so that the number of pits generated on the evaluation silicon wafer becomes $0.1/cm^2$ or less.

8 Claims, 26 Drawing Sheets

(51) Int. Cl.
    *C30B 15/14*     (2006.01)
    *C30B 29/06*     (2006.01)
    *B28D 5/00*     (2006.01)
    *C30B 25/10*     (2006.01)
    *C30B 25/18*     (2006.01)
    *C30B 33/00*     (2006.01)

(52) U.S. Cl.
    CPC ............ *C30B 15/206* (2013.01); *C30B 25/10* (2013.01); *C30B 25/186* (2013.01); *C30B 29/06* (2013.01); *C30B 33/00* (2013.01)

(56) References Cited

U.S. PATENT DOCUMENTS

| | | | |
|---|---|---|---|
| 2003/0068502 A1* | 4/2003 | Togashi | C30B 15/00 428/446 |
| 2005/0081779 A1* | 4/2005 | Sonokawa | C30B 15/14 117/14 |
| 2006/0035448 A1 | 2/2006 | Krautbauer et al. | |
| 2007/0028833 A1* | 2/2007 | Abe | C30B 15/305 117/14 |
| 2010/0127354 A1* | 5/2010 | Ono | C30B 15/14 257/618 |
| 2010/0133485 A1 | 6/2010 | Kawazoe et al. | |
| 2010/0309461 A1* | 12/2010 | Kamiyama | G01N 21/9501 356/237.2 |
| 2011/0120367 A1 | 5/2011 | Narushima et al. | |
| 2011/0140241 A1 | 6/2011 | Kawazoe et al. | |
| 2012/0112190 A1* | 5/2012 | Kawashima | H01L 21/02381 257/51 |
| 2014/0001605 A1 | 1/2014 | Kawashima et al. | |

FOREIGN PATENT DOCUMENTS

| | | |
|---|---|---|
| JP | 2010-30853 A | 2/2010 |
| JP | 2010-153631 A | 7/2010 |
| JP | 2011-9613 A | 1/2011 |
| WO | 2008/146724 A1 | 12/2008 |
| WO | 2010/021272 A1 | 2/2010 |

OTHER PUBLICATIONS

PCT Search Report in priority application PCT/JP2014/060721, dated Jul. 15, 2014.

PCT International Preliminary Report on Patentablity in priority application PCT/JP2014/060721, dated Oct. 27, 2015 along with an English translation thereof.

Office Action issued in German family member Patent Appl. No. 112014002133.4, dated Nov. 21, 2016, along with an English translation thereof.

* cited by examiner

FIG.19
INITIAL STAGE: 157 kg CHARGE
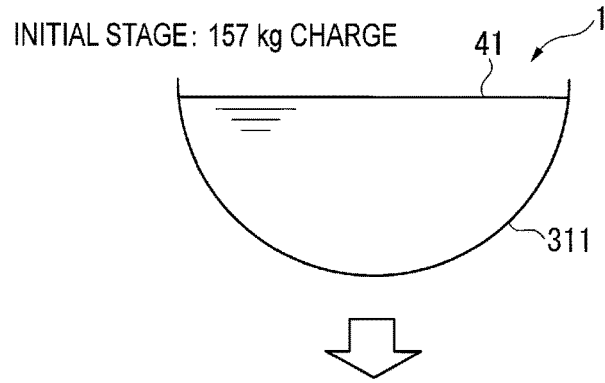
PULL UP 31 kg OF CRYSTAL
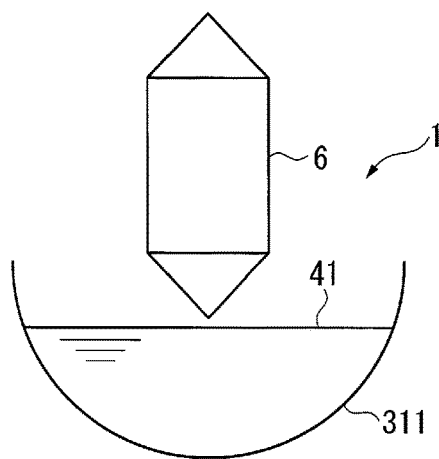
PULL UP 31 kg OF CRYSTAL
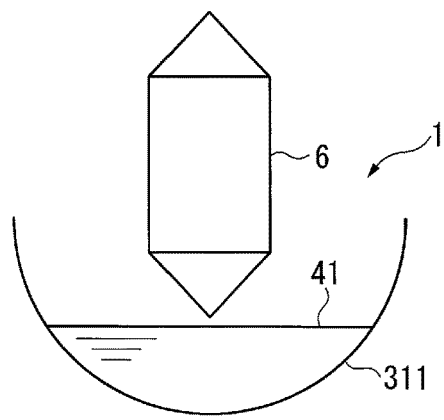

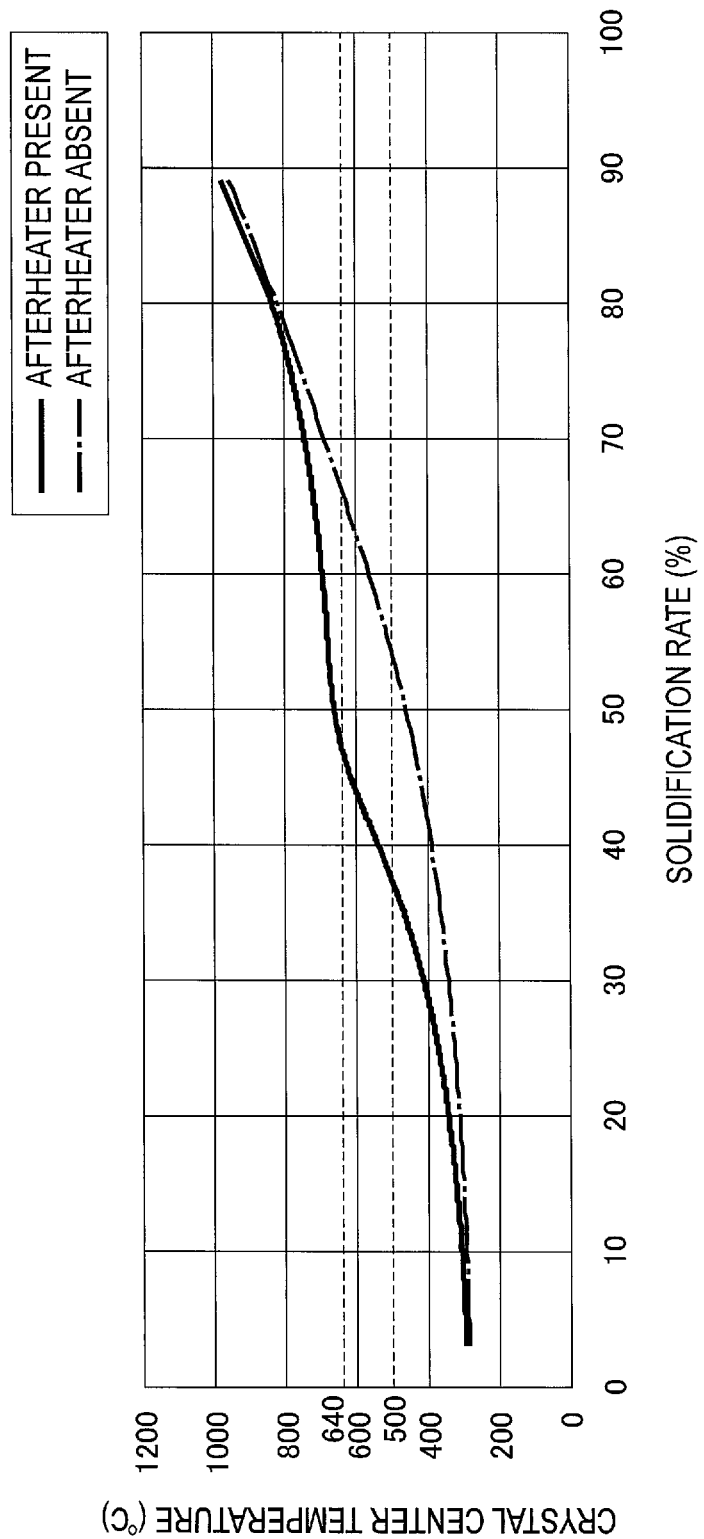

US 10,233,562 B2

METHOD FOR PRODUCING SINGLE CRYSTAL, AND METHOD FOR PRODUCING SILICON WAFER

TECHNICAL FIELD

The present invention relates to a method for manufacturing a red-phosphorus-added single crystal with a low resistivity, a method for manufacturing a silicon wafer, a method for manufacturing an epitaxial silicon wafer, a single crystal, and an epitaxial silicon wafer.

BACKGROUND ART

Epitaxial silicon wafers for power MOS transistors, for instance, is required to have extremely low substrate resistivity. In order to sufficiently lower the substrate resistivity of silicon wafers, it is known to dope molten silicon with an n-type dopant for resistivity adjustment (e.g. arsenic (As) and antimony (Sb)) during pull-up step (i.e. in growing silicon crystal) of a single crystal ingot (referred to as a "single crystal" hereinafter) for providing silicon wafers. However, since such dopants are extremely volatile, it is difficult to sufficiently increase the dopant concentration in the silicon crystals. Thus, silicon wafers exhibiting desired sufficiently low resistivity is difficult to be manufactured.

Accordingly, silicon wafers with extremely low substrate resistivity have come to be used, in which phosphorus (P) as an n-type dopant that is less volatile than arsenic (As) and antimony (Sb) is densely doped.

On the other hand, since epitaxial growth occurs on an epitaxial silicon wafer at a high temperature, oxygen precipitates (BMD) or oxygen precipitation nuclei formed in the crystal while growing the single crystal are dissipated by the high temperature heat treatment, thereby lowering gettering ability.

In order to overcome the shortage in gettering ability, it is known to apply a polysilicon back-seal (PBS) before the epitaxial growth. The polysilicon back seal method is a kind of EG (External Gettering), in which a polysilicon film is formed on a backside of a silicon wafer to make use of strain fields or lattice mismatch created at an interface between the polysilicon film and the silicon wafer.

It is found that, however, when a polysilicon film is grown on a backside of a silicon wafer, a number of stacking faults (abbreviated as "SF" hereinafter) are generated on the epitaxial film, the SF appearing on a top side of the silicon wafer in a form of steps to significantly deteriorate LPD (Light Point Defect) level on the top side of the silicon wafer.

Accordingly, studies have been made in order to restrain the above disadvantage (see, for instance, Patent Literature 1).

Patent Literature 1 discloses that the generation of SF can be effectively restrained by forming a polysilicon film on a backside of a silicon wafer at a temperature less than 600 degrees C.

CITATION LIST

Patent Literature(s)

Patent Literature 1 JP-A-2011-9613

SUMMARY OF THE INVENTION

Problem(s) to be Solved by the Invention

There is a recent need for an n-type silicon wafer of which substrate resistivity is 0.9 mΩ·cm or less. In order to meet such a need, an epitaxial silicon wafer produced by forming an epitaxial film on a silicon wafer, in which red phosphorus is densely doped when growing a single crystal, is required.

It is conceivable to apply the process disclosed in Patent Literature 1 in order to manufacture such an epitaxial silicon wafer.

However, when the substrate resistivity is extremely low, generation of SF cannot be restrained even by applying the process disclosed in Patent Literature 1, so that a high-quality epitaxial silicon wafer cannot be manufactured.

An object of the invention is to provide a method for manufacturing a single crystal with a low resistivity and a high quality, a method for manufacturing a silicon wafer, a method for manufacturing an epitaxial silicon wafer, and a single crystal.

Means for Solving the Problem(s)

After vigorous studies, the inventors of the present application have reached the following findings.

As described in Patent Literature 1, it is observed that, on a substrate formed with a polysilicon film, SF generated after an epitaxial growth is originated from pits (minute recesses) present on the surface of the silicon wafer before the epitaxial growth (afterprebaking).

The pits are not observed on a silicon wafer in which boron (B) as a p-type dopant is densely doped before being subjected to a prebaking treatment. Thus, it is speculated that it is highly likely that the generation of pits is related to phosphorus densely doped in the crystals of the silicon wafer.

It is speculated that the pits are generated according to the following mechanism. Specifically, oxygen and red phosphorus are present between crystal lattices of the silicon wafer before the formation of a polysilicon film. When the concentration of red phosphorus in the silicon wafer is raised in order to lower the substrate resistivity, supersaturated red phosphorus is present between the crystal lattices.

When the silicon wafer is heated in order to form the polysilicon film in this state, since the diffusion rate of oxygen is greater than the diffusion rate of red phosphorus, oxygen moves through the lattices to be bonded with red phosphorus, whereby clusters (micro-precipitates) of oxygen and red phosphorus are formed.

When the silicon wafer before the epitaxial growth is prebaked in a hydrogen atmosphere, though the oxygen and red phosphorus in an outermost layer of the silicon wafer outwardly diffuses, the clusters remain in the outermost layer because they are in a stable state. Then, when the silicon wafer is subjected to hydrogen etching, due to a difference in an etching rate between the outermost layer of the silicon wafer and the clusters, the clusters are preferentially etched to provide the pits.

It is speculated that, when the silicon wafer provided with the pits is subjected to an epitaxial growth, the SF originating from the pits are generated.

As described above, since the SF are generated due to the pits originating from the clusters of oxygen and red phosphorus, it is believed that the generation of the SF can be restrained by not applying the polysilicon back seal in which a heating (related to the formation of clusters) is performed. Without a polysilicon film, gettering ability may be lowered. However, the gettering ability can be maintained by increasing the concentration of red phosphorus. Thus, the inventors of the invention speculated that the generation of the SF can be restrained without lowering the gettering ability even without a polysilicon film.

However, it was found after experiments made by the inventors that, when the concentration of red phosphorus was further increased in order to adjust the substrate resistivity at 0.9 mΩ·cm or less, the generation of the SF could not be restrained only without applying the polysilicon back seal, which is a result that had not been expected so far. However, when a distribution of the SF in the longitudinal direction of the crystal grown during the experiments was examined in detail in corresponding epitaxial wafers, it was found that a part of the single crystal with a solidification rate of less than approximately 60% had 10 or more number of SF per one square centimeter in a silicon wafer of 200 mm diameter (will be referred to simply as "SF number" hereinafter) and the SF number was 0 in another part with the solidification rate of more than the above level (i.e. approximately 60%) (an area encircled by dotted lines) as shown in FIG. 1. In other words, it was found that the SF number was dependent on the solidification rate of the single crystal.

It should be noted that the solidification rate refers to a ratio of pulled-up weight of the single crystal relative to an initial charge weight of a dopant-added melt initially stored in a quartz crucible. The SF number was measured by observing an appearance of the defects with Magics manufactured by Lasertec Corporation.

As a result of studies on the difference between the part with the solidification rate of less than approximately 60% and the part with the solidification rate of more than approximately 60% in view of the above results, the inventors noted that thermal hysteresis experienced by the crystal might have affected the SF number.

Thus, the inventors conducted experiments to examine a correlation between the solidification rate and the thermal hysteresis.

Experiment 1: Study on Relationship Between Solidification Rate/Thermal Hysteresis and SF Number In a manufacturing process of a usual single crystal, a step for forming a shoulder continuous with a seed crystal and having a gradually increasing diameter (shoulder-formation step), a step for forming a straight body continuous with the shoulder and having a substantially constant diameter (straight-body-formation step) and a step for forming a tail continuous with a lower end of the straight body and having a diameter gradually reduced to zero (tail-formation step) are performed. After the tail-formation step is completed, a step for cooling the single crystal (cooling step) is performed and the single crystal is taken out of a pull-up device.

Since the single crystal experiences the above manufacturing process, it is deduced that a cooling time elapsed after being pulled out of the dopant-added melt becomes shorter toward a lower end of the single crystal (i.e. as the solidification rate increases).

Initially, a single crystal was manufactured according to the above manufacturing process and a residence time in each of temperatures (500±50 degrees C., 700±50 degrees C., 900±50 degrees C., 1100±50 degrees C.) for each of the solidification rates was measured. The results are shown in FIG. 2. It should be noted that red phosphorus (dopant) was added to the silicon melt to provide the dopant-added melt so that the substrate resistivity of silicon wafers became 0.9 mΩ·cm or less. In addition, a charge amount of the dopant-added melt was set at 100 kg.

As shown in FIG. 2, it was found that, the residence time particularly at 500±50 degrees C. was extremely shorter in the section with more than 60% of the solidification rate (an area encircled by chain double-dashed lines) than in the section with the solidification rate of less than 60%.

In addition, silicon wafers corresponding to the plurality of solidification rates were cut out from the single crystal to manufacture epitaxial silicon wafers, and the SF number of each of the epitaxial silicon wafers was examined. The results are shown in FIG. 2.

It should be noted that the epitaxial silicon wafer was manufactured by forming an epitaxial film after applying a prebaking treatment without providing a polysilicon film. Further, the prebaking treatment was performed by heating the silicon wafer before forming the epitaxial film for 30 seconds in a hydrogen atmosphere at 1200 degrees C.

As shown in FIG. 2, it was found that the SF number substantially correlates with the residence time of the single crystal at the temperature of 500±50 degrees C. and the SF number became zero at a section where the solidification rate was more than 60%.

As described above, it was found that the generation of SF can be restrained by reducing the time for a temperature of the single crystal to be 500±50 degrees C.

Experiment 2: Research on Generation Status of LPD Before and after Prebaking Treatment Initially, LPD on a silicon wafer and LPD after prebaking on the silicon wafer were evaluated.

Specifically, a silicon wafer satisfying the following substrate conditions and being taken from a single crystal with a solidification rate causing the SF generation (i.e. corresponding to the solidification rate causing the SF) and another silicon wafer corresponding to the solidification rate not causing the SF were prepared.

Substrate Conditions
Diameter: 200 mm
Substrate Resistivity: 0.8 mΩ·cm
(red phosphorus concentration: $9.47 \times 10^{19}$ atoms/cm$^3$)

Next, a backside oxidation film satisfying the following backside-oxidation-film formation conditions was formed on a backside (a face opposite a face on which an epitaxial film was formed) of each of the silicon wafers.

Backside-Oxidation-Film Formation Conditions
Film-forming method: CVD
Thickness of backside oxidation film: 550 nm Then, the backside oxidation film at an outer periphery of the silicon wafer was removed from each of the silicon wafers provided with the backside oxidation film formed according to the above conditions to perform the LPD evaluation. Incidentally, the LPD was evaluated according to the following LPD evaluation conditions.

LPD Evaluation Conditions
Used Apparatus: surface inspection system (SP-1 manufactured by KLA-Tencor Corporation)
Observation mode: DWN mode
Object to be measured: LPD of 90 nm or larger FIG. 3 shows measurements of the silicon wafer corresponding to the solidification rate causing SF generation. Though not illustrated herein, the measurements of the silicon wafer corresponding to the solidification rate not causing the SF generation were substantially the same as those shown in FIG. 3.

Additionally, the silicon wafers on each of which the backside oxidation film was formed according to the above conditions were subjected to prebaking treatment satisfying the following conditions. The prebaking conditions simulate the conditions for the formation of the epitaxial film.

Prebaking Conditions
Atmosphere: hydrogen
Heat treatment temperature: 1200 degrees C.
Heat treatment time: 30 seconds Then, the LPD evaluation of each of the silicon wafers after applying the prebaking treatment according to the above-described conditions was performed according to the above-described LPD evaluation conditions in Experiment 2. The results are shown in FIGS. 4 and 5.

As shown in FIG. 4, it was found that LPD 101 increased after the prebaking treatment in one of silicon wafers 100 corresponding to the solidification rate causing the SF generation. On the other hand, as shown in FIG. 5, it was found that the LPD 101 kept substantially unchanged before and after the prebaking treatment in the silicon wafers 100 corresponding to the solidification rate not causing the SF generation.

When the silicon wafer shown in FIG. 4 in which the LPD was increased was observed with an AFM (Atomic Force Microprobe), it was found that the LPD was in a form of a pit P as shown in FIG. 6. In other words, it was found that the pit P generated after the prebaking treatment could be measured as the LPD of 90 nm or larger in the DCN mode of SP-1 manufactured by KLA-Tencor Corporation.

Experiment 3: Research on Generation Status of LPD Before and after Epitaxial Film Growth In the above Experiment 2, the silicon wafer corresponding to the solidification rate causing the SF generation as shown in FIG. 4 was applied with the prebaking treatment and, subsequently, an epitaxial film satisfying the following epitaxial film growth conditions was formed on a surface of the silicon wafer to prepare an epitaxial silicon wafer.

Epitaxial Film Growth Conditions
Dopant gas: phosphine ($PH_3$) gas
Material source gas: trichlorosilane ($SiHCl_3$) gas
Carrier gas: hydrogen gas
Growth temperature: 1080 degrees C.
Thickness of epitaxial film: 3 μm
Resistivity (epitaxial film resistivity): 1 Ω·cm
(red phosphorus concentration: $4.86 \times 10^{15}$ atoms/$cm^3$)

Then, the LPD evaluation of the epitaxial silicon wafer prepared according to the above-described conditions was performed according to the LPD evaluation conditions in Experiment 2. In addition, the LPD evaluation results of the epitaxial silicon wafer were overlapped with the LPD evaluation results of the surface of the silicon wafer after applying the prebaking treatment in the experiment shown in FIG. 4 (i.e. before growing the epitaxial film) for comparison. The results are shown in FIG. 7. In addition, distribution of LPD in an area encircled by chain double-dashed lines in FIG. 7 is shown in FIG. 8 in an enlarged manner.

As shown in FIG. 7, it was found that, though LPD were generated all over the surface of each the epitaxial wafers, many LPD were generated in an entire annular area A1 at a distance of approximately 2 to 6 cm from an outer edge of the epitaxial silicon wafer. Further, as shown in FIG. 8, it was found that points of LPD before and after the growth of the epitaxial film substantially coincide with each other.

In addition, in the LPD-generated points on the epitaxial silicon wafer, the points at which LPD had generated before growing the epitaxial film were evaluated according to the following LPD evaluation conditions.

LPD Evaluation Conditions
Used Apparatus: Surface inspection system (Magics manufactured by Lasertec Corporation)

As a result, it was found that flat-type SF of a rectangular plan and triangular cross section (i.e. substantially quadrangular pyramid having a bottom face substantially flush with a surface of the epitaxial film and an apex recessed toward the silicon wafer) were generated at the evaluated points.

Experiment 4: Study on Temperature Condition Capable of Reducing Generation of SF After manufacturing a single crystal under the same conditions as those in Experiment 1, without starting a cooling step, the pull-up of the single crystal was suspended for 10 hours while the tail was out of a dopant-added melt and the single crystal was kept being heated in the heating condition during a tail-formation step. During the suspension, the temperature distribution at the center of the single crystal for each of the solidification rates was as shown in FIG. 9.

Subsequently, after the single crystal was taken out from a pull-up device after elapsing 10 hours, epitaxial silicon wafers were manufactured under the same conditions as those in Experiment 1 (i.e. an epitaxial film was formed after applying a prebaking treatment in a hydrogen atmosphere at 1200 degrees C. for 30 seconds on a silicon wafer obtained from the single crystal). Then, the relationship between the number of LPD per each of epitaxial silicon wafers of 200 mm diameter (simply referred to as "LPD number" hereinafter) and the solidification rate was examined. The results are shown in FIG. 10.

Herein, the LPD number was measured with DCN mode of SP-1 manufactured by KLA-Tencor Corporation. The LPD to be measured was those with the size of 90 nm or more. Further, since there is a good correlation between the LPD number and the SF number, the LPD number was substituted by the SF number.

As shown in FIG. 10, it was found that the LPD number rapidly increased from a point at which the solidification rate was approximately 52%, was maximized approximately at 62% and was substantially 0 when the solidification rate exceeded 70%. It was also found that the temperature at the point at which the solidification rate was approximately 52% (i.e. the temperature at which rapid increase in the LPD number started) was approximately 470 degrees C.; the temperature at the point at which the solidification rate was approximately 62% (i.e. the temperature at which the LPD number was maximized) was approximately 570 degrees C.; and the temperature at the point at which the solidification rate was approximately 70% (i.e. the temperature at which the LPD number became substantially zero) was approximately 700 degrees C.

According to the above results, it was found that SF was likely to be generated when the temperature of the single crystal was kept for a long time approximately at 470 to 700 degrees C., especially approximately at 570 degrees C.

Next, a tolerable range relative to a central temperature was determined.

Specifically, based on the experimental results in the above FIG. 10, a residence time at each of temperatures (550±30 degrees C., 570±30 degrees C. and 600±30 degrees C.) for each of corresponding solidification rates was examined. The results are shown in FIG. 11. Additionally, the residence time at each of temperatures 550±50 degrees C., 570±50 degrees C. and 600±50 degrees C. is shown in FIG. 12 and the residence time at each of temperatures 550±70 degrees C., 570±70 degrees C. and 600±70 degrees C. is shown in FIG. 13.

As shown in FIGS. 11 to 13, it was found that an increase width of the residence time at each of temperatures 550±70 degrees C., 570±70 degrees C. and 600±70 degrees C. (i.e. a horizontal length in the figure) and an increase width of the LPD number (i.e. horizontal length in the figure) substantially coincided with each other.

Thus, it was found that LPD was likely to be generated when the temperature of the single crystal was kept for a long time at 570±70 degrees C.

Additionally, the inventors examined in order not to generate LPD how long time is tolerable for the single crystal to be kept at a temperature in the range of 570±70 degrees C.

Initially, after performing the tail-formation step under the same conditions as in Experiment 1, the single crystal was gradually cooled as shown in solid lines in FIG. 14 instead of rapidly cooling in a usual cooling step as shown in chain double-dashed lines in FIG. 17. It should be noted that ordinate axis in FIG. 14 represents a residence time in a temperature range of 650±50 degrees C.

Then, with the use of the single crystal manufactured according to the conditions represented by the solid lines in FIG. 14, epitaxial silicon wafers were manufactured under the same conditions as in Experiment 1 to examine the LPD number in each of the solidification rates. The relationship between the residence time in each of the solidification rates and the LPD number is shown in FIG. 15. It should be noted that ordinate axis in FIG. 15 represents a residence time in a temperature range of 570±70 degrees C.

As shown in FIG. 15, it was found that the LPD number became 0 when the solidification rate exceeded approximately 66%. It was also found that the residence time in the range of 570±70 degrees C. at this time was approximately 200 minutes.

Thus, it is speculated that it is possible to restrain the generation of LPD by reducing the time for the temperature of the single crystal to be 570±70 degrees C. to 200 minutes or less.

Next, an experiment for verifying the experimental results in FIG. 15 was conducted.

After performing the tail-formation step under the same conditions as in Experiment 1, a cooling step as shown in a chain double-dashed line in FIG. 14 was performed to manufacture a single crystal. Then, with the use of the single crystal, epitaxial silicon wafers were manufactured under the same conditions as in Experiment 1 to examine the LPD number in each of the solidification rates. The results are shown in FIG. 16.

As shown in FIG. 16, it was found that, when the solidification rate was over approximately 44%, the time for the single crystal to be in the range of 570±70 degrees C. became from 20 to 200 minutes and the LPD number was reduced.

Thus, it is found that it is possible to restrain the generation of LPD not only in a latter half of the single crystal but also in the entire length of the single crystal by setting the time for a single crystal to be at the temperature of 570±70 degrees C. in a range from 20 to 200 minutes. The manufacture process of a single ingot includes a step for forming a shoulder continuous with a seed crystal and having a gradually increasing diameter (shoulder-formation step), a step for forming a straight body continuous with the shoulder and having a substantially constant diameter (straight-body-formation step) and a step for forming a tail continuous with a lower end of the straight body and having a diameter gradually reduced to zero (tail-formation step). It should be noted that that the entire length of the single crystal refers to an entire length of the straight body with a substantially constant diameter formed in the straight-body-formation step.

The invention has been reached based on the above findings.

A manufacturing method of a single crystal according to an aspect of the invention uses a single-crystal pull-up apparatus including a chamber, a crucible disposed in the chamber and adapted to receive a dopant-added melt in which red phosphorus is added to a silicon melt, and a pull-up portion that is configured to pull up a seed crystal after the seed crystal is brought into contact with the dopant-added melt. The method includes: adding the red phosphorus to the silicon melt so that a resistivity of the single crystal falls in a range from 0.7 m$\Omega$·cm to 0.9 m$\Omega$·cm; subjecting an evaluation silicon wafer obtained from the single crystal to a heat treatment in which the evaluation silicon wafer is heated at 1200 degrees C. for 30 seconds in a hydrogen atmosphere; and pull-up the single crystal while appropriately controlling a period for a temperature of the single crystal to be in a range of 570±70 degrees C. so that the number of pit generated on the evaluation silicon wafer becomes 0.1/cm$^2$ or less.

According to the above aspect of the invention, even when a single crystal of which resistivity is lowered (e.g. to be in a range from 0.7 m$\Omega$·cm to 0.9 m$\Omega$·cm) by adding red phosphorus in the silicon melt is to be manufactured, the number of pits generated on the silicon wafer after applying a prebaking treatment (a heat treatment for applying heat in a hydrogen atmosphere at 1200 degrees C. for 30 seconds) to the silicon wafer obtained from the single crystal can be 0.1/cm$^2$ or less by appropriately controlling the period for the temperature of the single crystal to be 570±70 degrees C.

Accordingly, when an epitaxial silicon wafer is manufactured using the single crystal, the LPD (of 90 nm or more) number on the surface of the silicon wafer measured by DCN mode of SP-1 manufactured by KLA-Tencor Corporation can be lowered to 0.1/cm$^2$ or less. Accordingly, an epitaxial silicon wafer with low resistivity and high quality can be obtained.

It should be noted that germanium (Ge) may be added to the silicon melt together with red phosphorus. According to the above arrangement, occurrence of dislocation defect (misfit dislocation) due to red-phosphorus concentration difference at an interface between the silicon wafer and the epitaxial film can be restrained.

In the above aspect of the invention, it is preferable that a cooler is disposed above the crucible in the chamber; and the single crystal is cooled with the cooler in a straight-body-formation step for forming a straight body of the single crystal, thereby appropriately controlling the period for the temperature of the single crystal to be in the range of 570±70 degrees C.

In the above aspect of the invention, it is preferable that a heater is disposed above the crucible in the chamber; the single crystal is heated with the heater in a straight-body-formation step for forming a straight body of the single crystal to restrain a decrease in the temperature of the single crystal and the single crystal is cooled after a tail-formation step for forming a tail of the single crystal, thereby appropriately controlling the period for the temperature of the single crystal to be in the range of 570±70 degrees C.

According to the above arrangements, with the use of the cooler or the heater, the period for the temperature of the single crystal to be in the range of 570±70 degrees C. can be controlled as desired.

In the above aspect of the invention, it is preferable that the single crystal is pulled up so that the period for the temperature of at least a part of the single crystal to be in the range of 570±70 degrees C. is in a range from 20 to 200 minutes.

With the above arrangement, the number of the pits generated on a silicon wafer obtained from the part of which temperature is within the above range for 20 to 200 minutes can be lowered to $0.1/cm^2$ or less.

A manufacturing method of a silicon wafer according to another aspect of the invention uses a single crystal obtained using a single-crystal pull-up apparatus comprising a chamber, a crucible disposed in the chamber and adapted to receive a dopant-added melt in which red phosphorus is added to a silicon melt, and a pull-up portion that is configured to pull up a seed crystal after the seed crystal is brought into contact with the dopant-added melt, the method including: adding the red phosphorus to the silicon melt so that a resistivity of the single crystal falls in a range from 0.7 m$\Omega$·cm to 0.9 m$\Omega$·cm; pull-up the single crystal; and cutting the silicon wafer from a portion of the single crystal, a temperature of the portion being 570±70 degrees C. for 20 to 200 minutes when the single crystal is pulled up.

A manufacturing method of an epitaxial silicon wafer according to still another aspect of the invention includes: a first step of cutting the silicon wafer from the single crystal manufactured through the manufacturing method of the single crystal according to the above aspect of the invention; a second step of heating the silicon wafer cut out in the first step in a hydrogen atmosphere; and a third step of forming an epitaxial film on the silicon wafer after the second step to manufacture the epitaxial silicon wafer.

According to the above arrangement, an epitaxial silicon wafer with low resistivity and high quality can be provided. Further, since a polysilicon film is not provided to the epitaxial silicon wafer, the process can be simplified.

A single crystal according to a further aspect of the invention is manufactured using a silicon melt added with red phosphorus so that a resistivity of the single crystal is in a range from 0.7 m$\Omega$·cm to 0.9 m$\Omega$·cm, the single crystal including: a straight body comprising a crystal region in which a number of a pit generated on a silicon wafer cut out from the single crystal is $0.1/cm^2$ or less after applying a heat treatment for heating the silicon wafer at 1200 degrees C. for 30 seconds.

An epitaxial silicon wafer according to a still further aspect of the invention includes: a silicon wafer cut out from the above single crystal; and an epitaxial film formed on the silicon wafer.

BRIEF DESCRIPTION OF DRAWING(S)

FIG. 19 is a schematic illustration showing a manufacturing method of a single crystal in an single-charge pull-up method according to a first modification of the invention.

FIG. 22A is another graph showing an effect of providing the heater (the afterheater) according to the second modification of the invention, which shows a relationship between a solidification rate of the single crystal and the temperature at the center (center temperature) of the single crystal.

DESCRIPTION OF EMBODIMENT(S)

Exemplary embodiment(s) of the invention will be described below with reference to the attached drawings.
Arrangement of Single-Crystal Pull-Up Apparatus Initially, an arrangement of a single-crystal pull-up apparatus will be described below.

Figure 17:
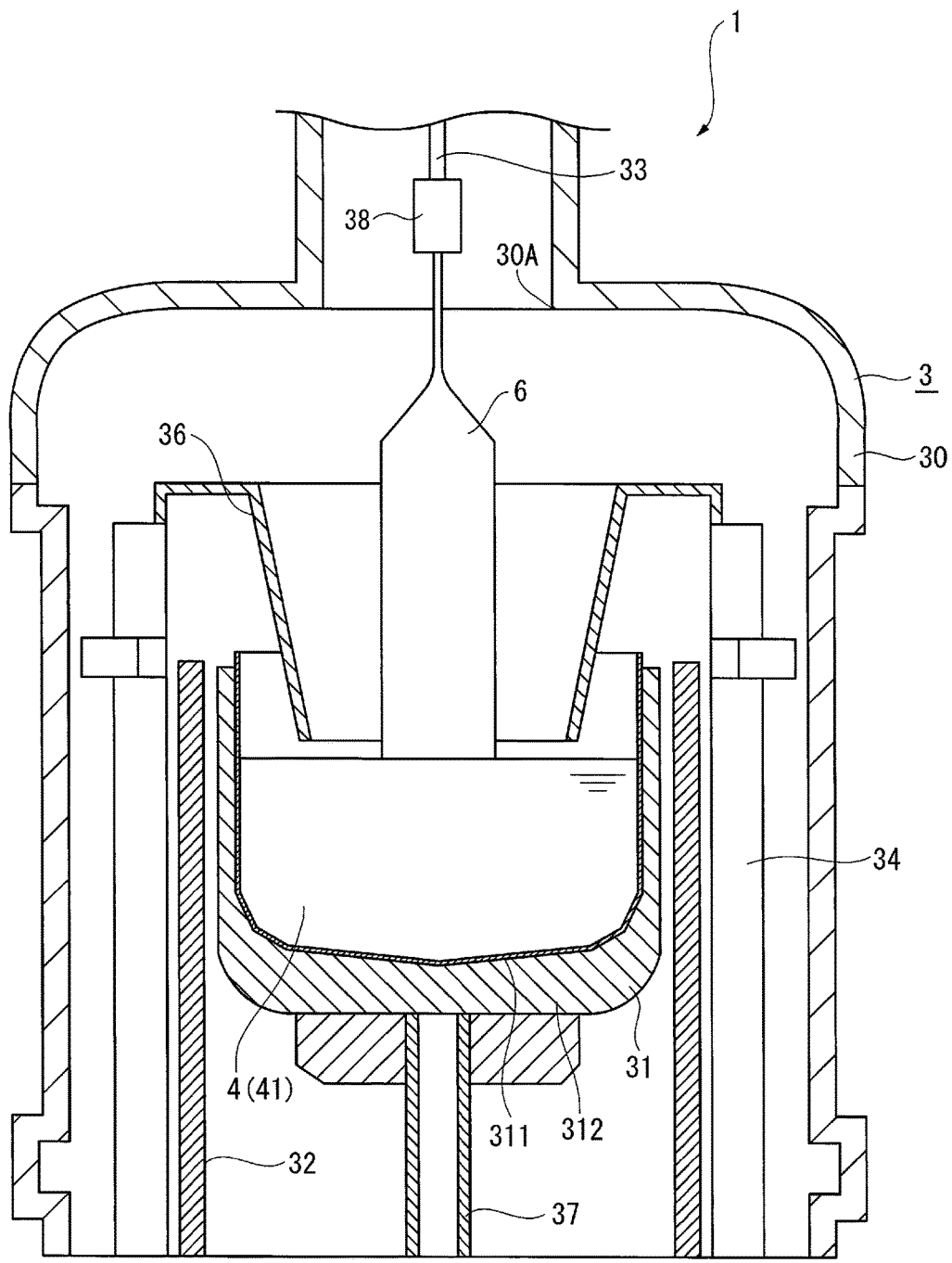
FIG. 17 is a schematic illustration showing an outline of a single-crystal pull-up apparatus according to an exemplary embodiment of the invention.

A single-crystal pull-up apparatus 1 includes a single-crystal pull-up apparatus body 3 as shown in FIG. 17, a doping device (not shown) and a controller (not shown).

The single-crystal pull-up apparatus body 3 includes a chamber 30, a crucible 31 disposed in the chamber 30, a heater 32 that radiates heat toward the crucible 31 to heat the crucible 31, a pull-up cable 33 (pull-up portion), a heat insulating cylinder 34, and a shield 36.

Inert gas (e.g. argon gas) is introduced into the chamber 30 from an upper side toward a lower side through an intake 30A provided to the upper side at a predetermined gas flow rate under the control of the controller. Further, the pressure within the chamber 30 (furnace pressure) is controllable by the controller.

The crucible 31 melts a polycrystal silicon (material of a silicon wafer) to provide a silicon melt 4. The crucible 31 includes a bottomed cylindrical quartz crucible 311 (i.e. a crucible made of quartz), and a graphite crucible 312 (i.e. a crucible made of graphite) disposed outside the quartz crucible 311 to receive the quartz crucible 311. The crucible 31 is supported by a support shaft 37 rotated at a predetermined speed.

The heater 32 is disposed outside the crucible 31. The heater 32 heats the crucible 31 to melt the silicon in the crucible 31.

A first end of the pull-up cable 33 is connected to a pull-up drive unit (not shown) disposed, for instance, above the crucible 31. Further, a second end of the pull-up cable 33 is attached to a seed holder 38 for holding a seed crystal or to a doping device (not shown), as desired. The pull-up cable 33 is rotatable by driving the pull-up drive unit. The pull-up cable 33 moves up at a predetermined pull-up speed by the pull-up drive unit under the control of the controller.

The heat insulating cylinder 34 is disposed to surround the crucible 31 and the heater 32.

The shield 36 serves as a heat shield for shielding radiation heat upwardly radiated from the heater 32. The shield 36 is disposed to partially cover the surface of the silicon melt 4. The shield 36 is in a form of a cone having a lower opening at a lower end and an upper opening at an upper end, the lower opening being smaller than the upper opening.

The doping device volatilize red phosphorus (solid volatile dopant) to dope (i.e. add) the red phosphorus to the silicon melt 4 in the crucible 31 to provide dopant-added melt 41. It should be noted that the doping device may include a cylindrical member having a lower end immersed in the silicon melt 4 to add red phosphorus in the silicon melt 4 or may be designed so that the cylindrical member has a lower end spaced apart from the silicon melt 4 and volatilized red phosphorus is blown to the silicon melt 4, thereby adding red phosphorus to the silicon melt 4.

The controller appropriately controls the gas flow rate and furnace pressure in the chamber 30, and pull-up speed of the pull-up cable 33 based on a setting by an operator to control a manufacture process of the single crystal 6.
Manufacturing Method of Single Crystal Next, an example of a process for manufacturing the single crystal 6 using the single-crystal pull-up apparatus 1 will be described below.

Initially, the process for manufacturing the single crystal 6 through a so-called multi-pull-up method, in which a polysilicon material 411 is charged in a single quartz crucible 311 each time the single crystal 6 is pulled up and a plurality of single crystals 6 are pulled up, will be described below.

Figure 18:
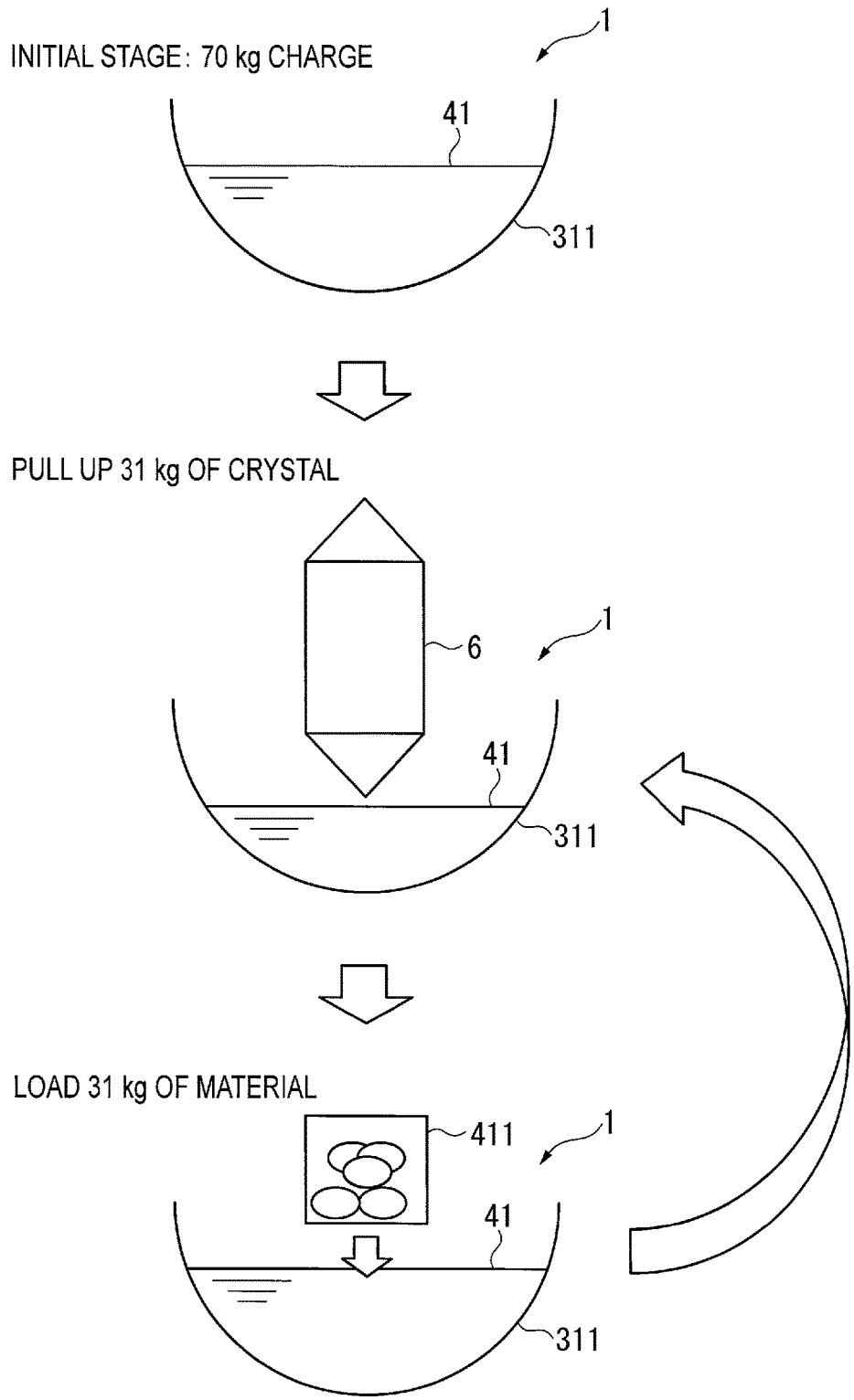
FIG. 18 is a schematic illustration showing a manufacturing method of a single crystal in a multi-pull-up method according to the exemplary embodiment.

As shown in FIG. 18, 70 kg of the polysilicon material is initially charged in the quartz crucible 311 in the single-crystal pull-up apparatus 1. Then, under the control of the controller, the polysilicon material is heated to be melted, and red phosphorus (volatile dopant) is added in the silicon melt 4 to provide the dopant-added melt 41 while the gas flow rate and furnace pressure in the chamber 30 are set at predetermined values.

It should be noted that germanium may be added together with red phosphorus in order to restrain misfit dislocation in the epitaxial silicon wafer. Further, the additive amount of red phosphorus is set so that resistivity of silicon wafer(s) cut out from the single crystal 6 comes in a range from 0.7 mΩ·cm to 0.9 mΩ·cm.

Subsequently, after immersing a seed crystal in the melt, the controller of the single-crystal pull-up apparatus 1 pulls up the seed crystal at a predetermined pull-up speed based on the setting by the operator to produce the single crystal 6.

Figure 1:
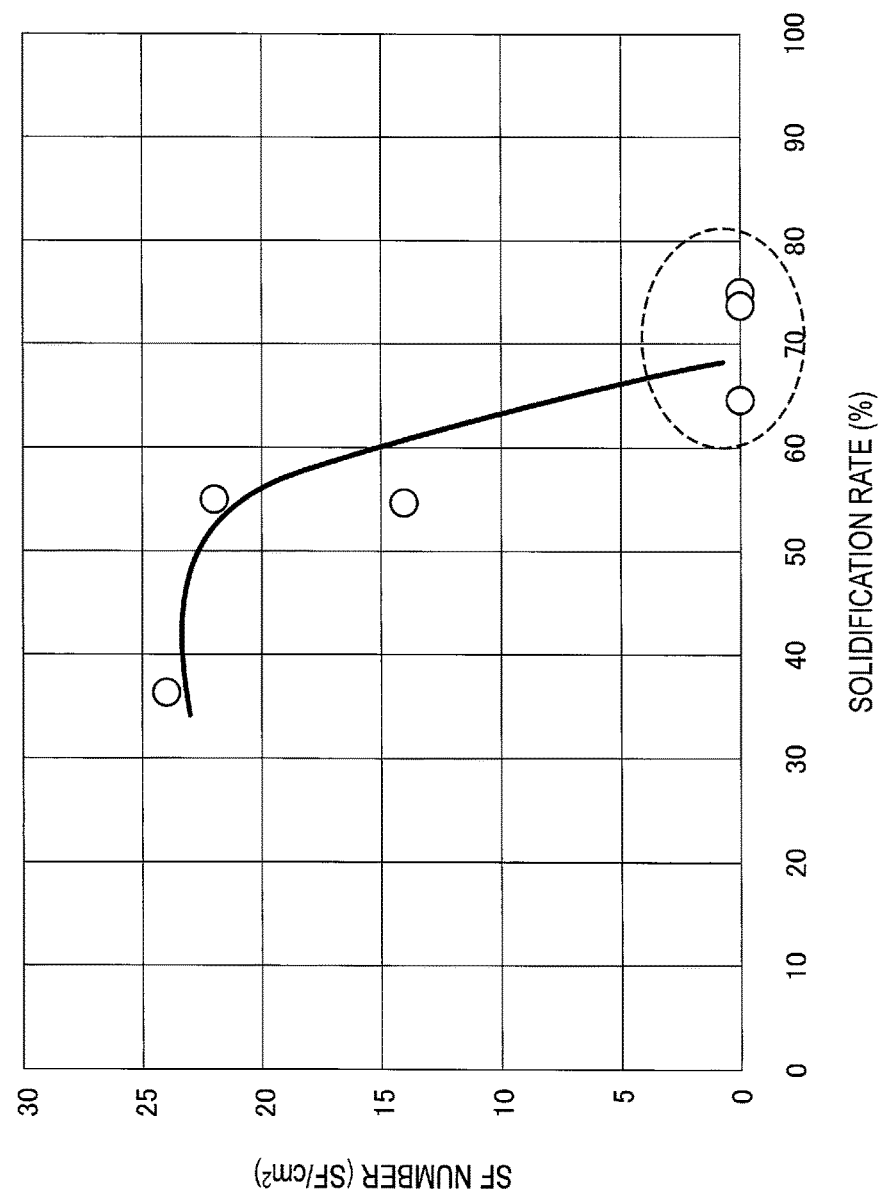
FIG. 1 is a graph showing results of an experiment for deriving a manufacturing condition of an epitaxial silicon wafer according to the invention, which shows a relationship between a solidification rate of a single crystal and an SF number.
Figure 2:
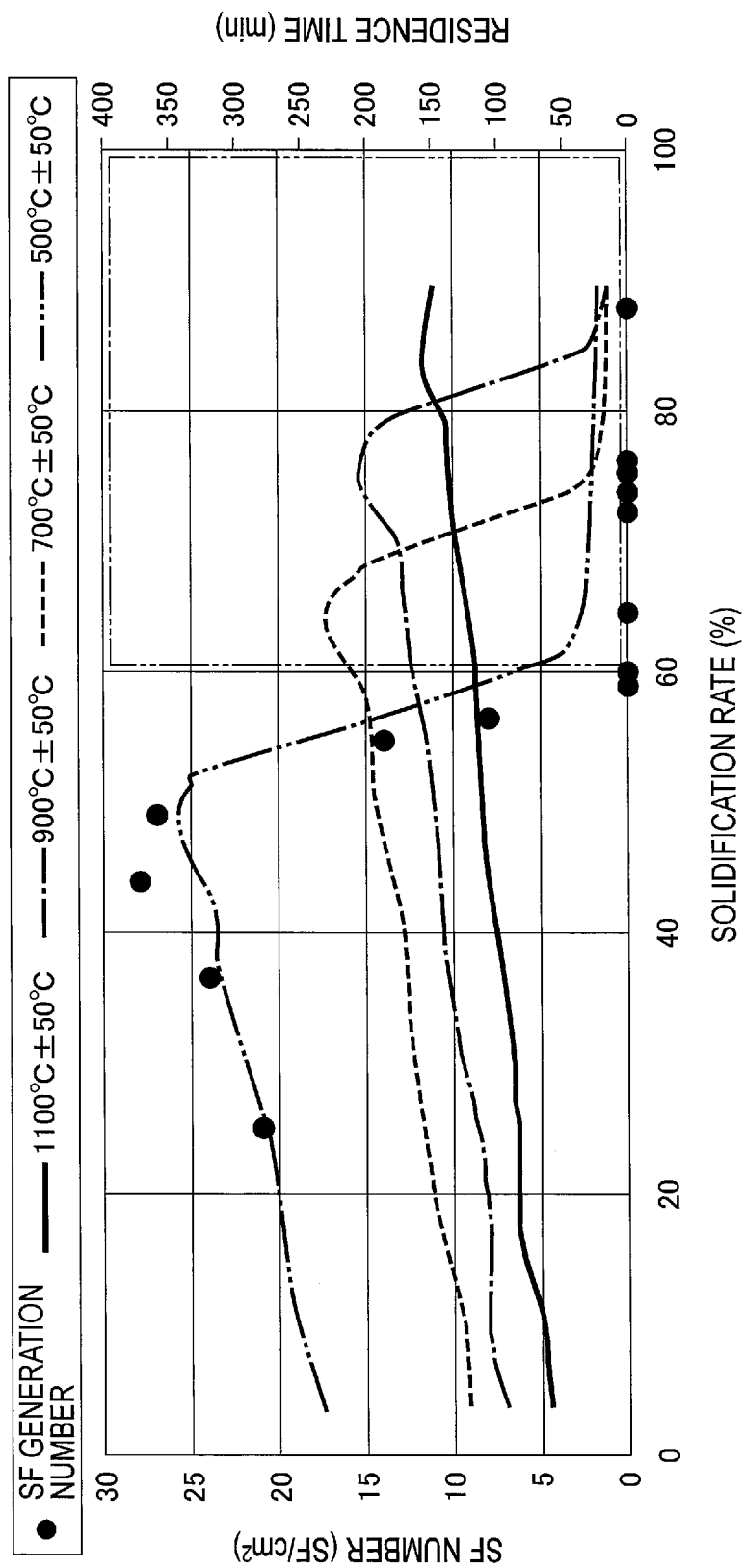
FIG. 2 is another graph showing results of Experiment 1 for deriving the manufacturing condition, which shows a relationship between the solidification rate, the SF number and a residence time at each of temperatures.
Figure 3:
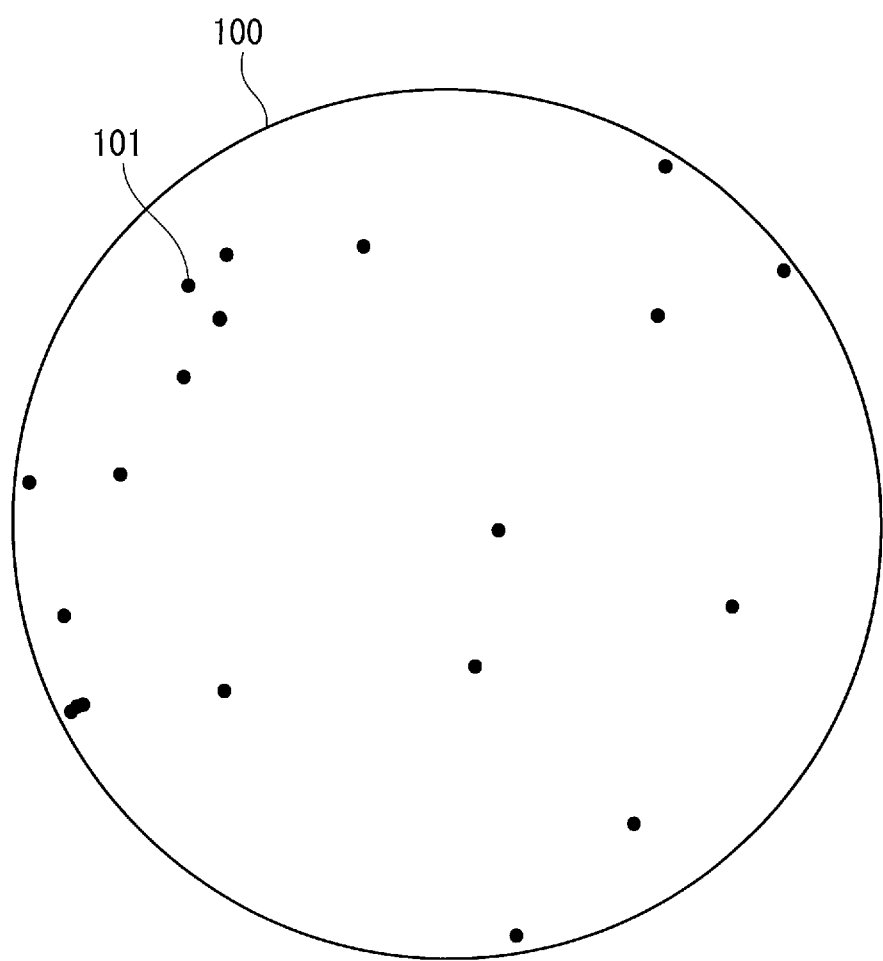
FIG. 3 shows results of Experiment 2 showing a generation state of LPD on a silicon wafer before prebaking.
Figure 4:
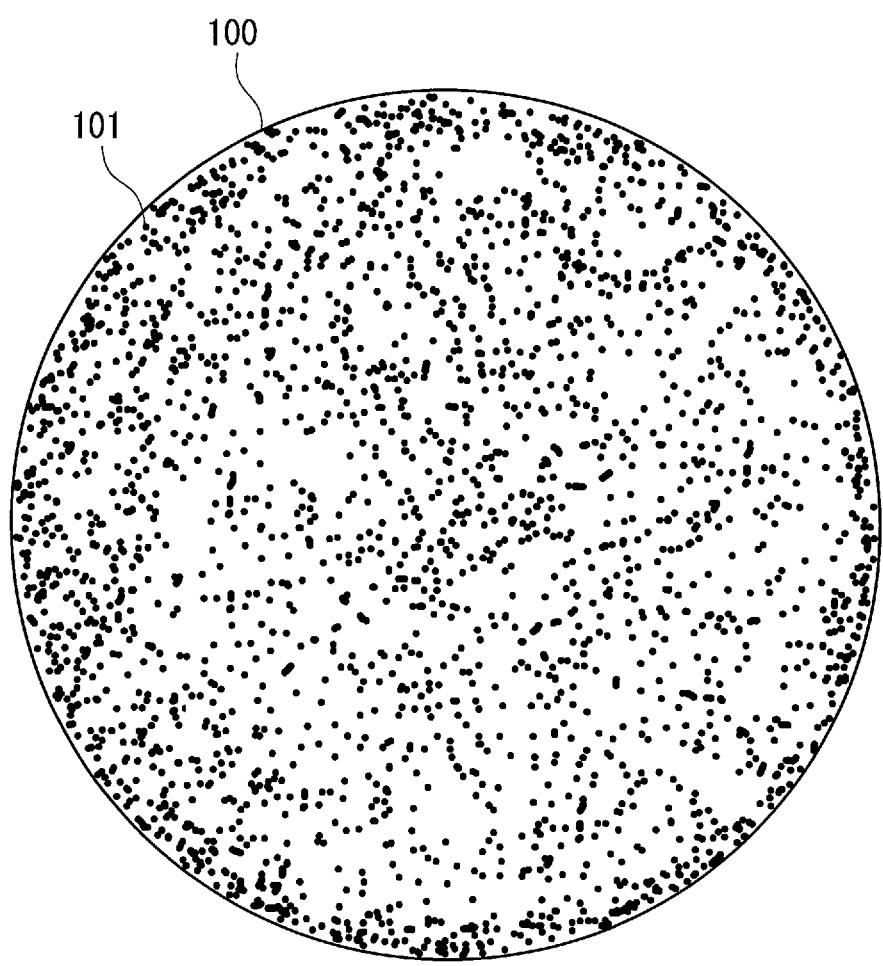
FIG. 4 shows results of Experiment 2 showing a generation state of LPD after the prebaking on the silicon wafer corresponding to a solidification rate at which SF are generated.
Figure 5:
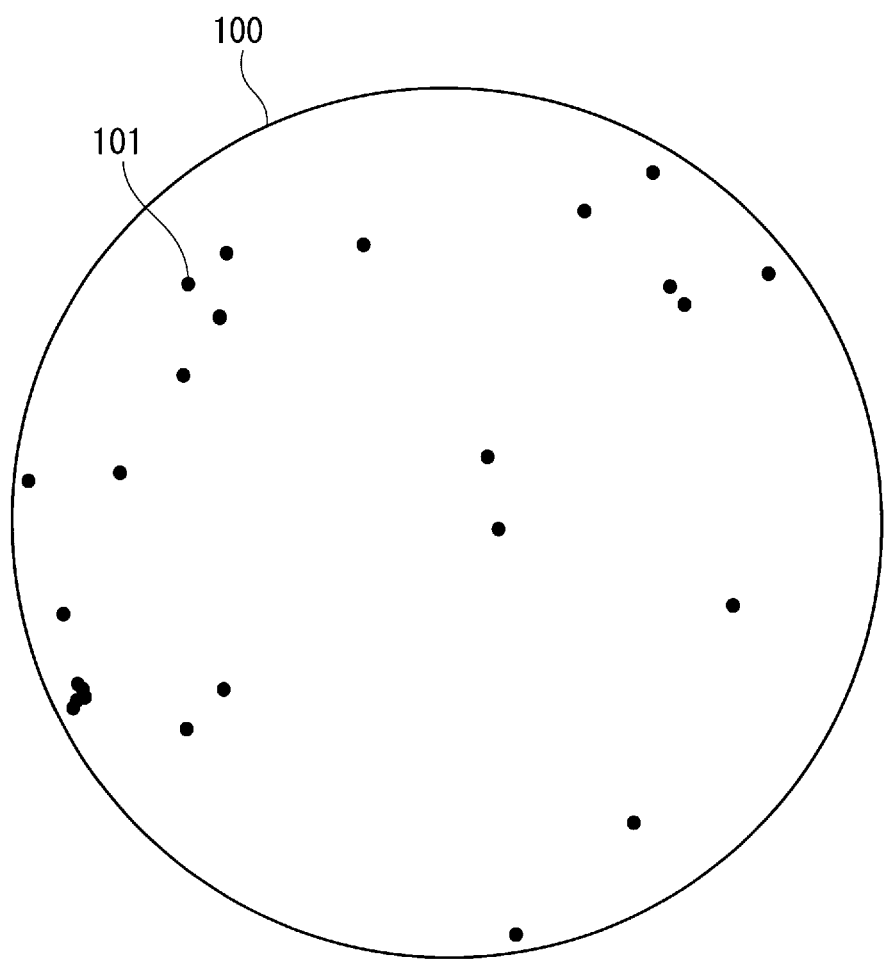
FIG. 5 shows results of Experiment 2 showing a generation state of LPD after the prebaking on the silicon wafer corresponding to a solidification rate at which the SF are not generated.
Figure 6:
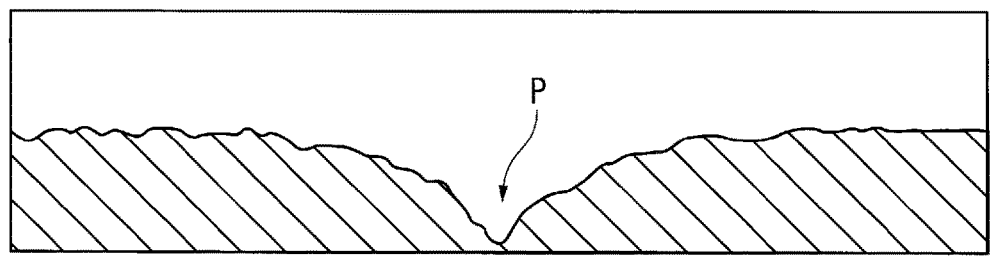
FIG. 6 shows the results of Experiment 2 showing AFM observation results of LPD increased after the prebaking.
Figure 7:
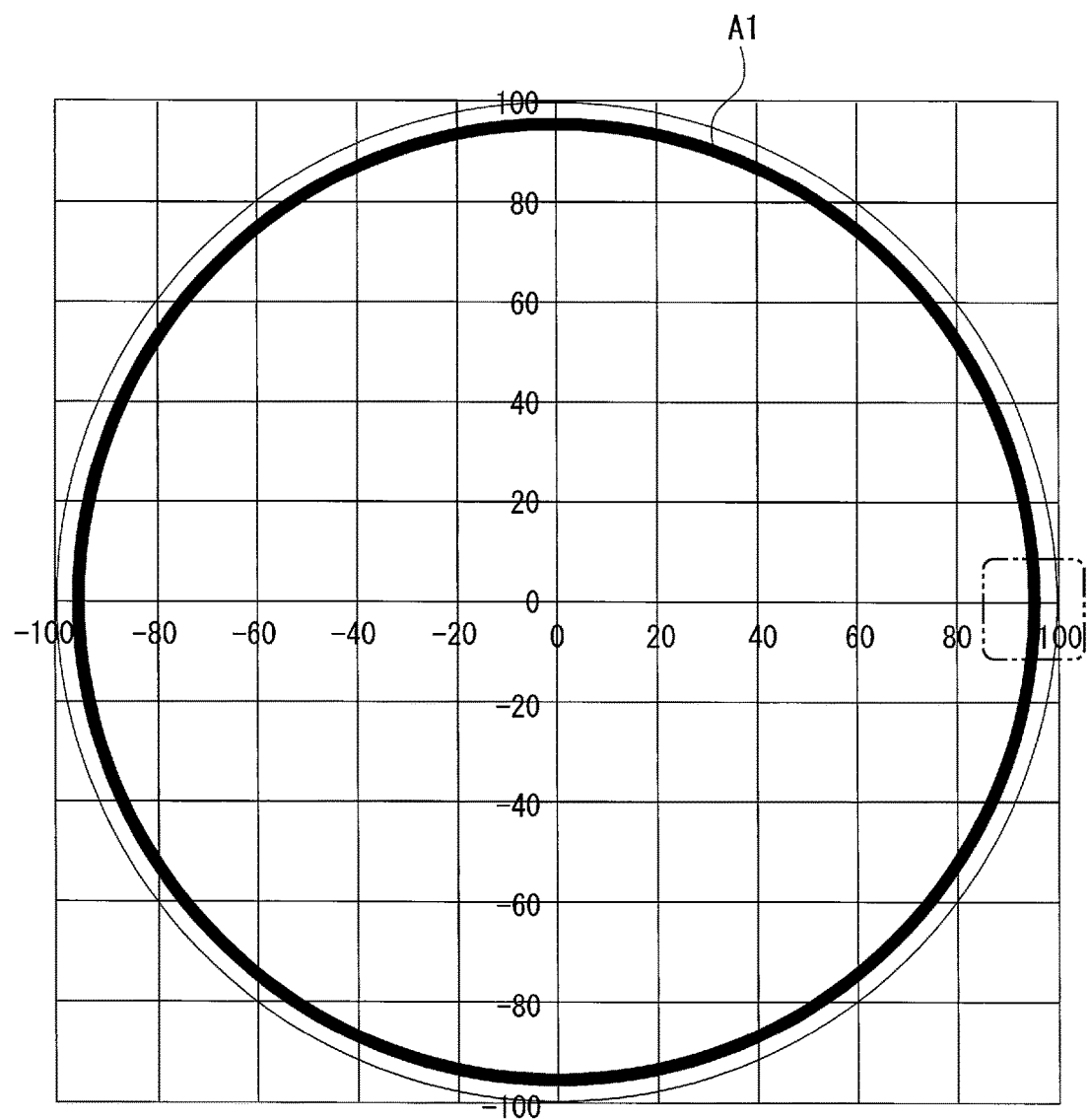
FIG. 7 shows results of Experiment 3 for deriving the manufacturing condition, which shows an LPD generation state after growing an epitaxial film and experimental results shown in FIG. 4 in an overlapped manner.
Figure 8:
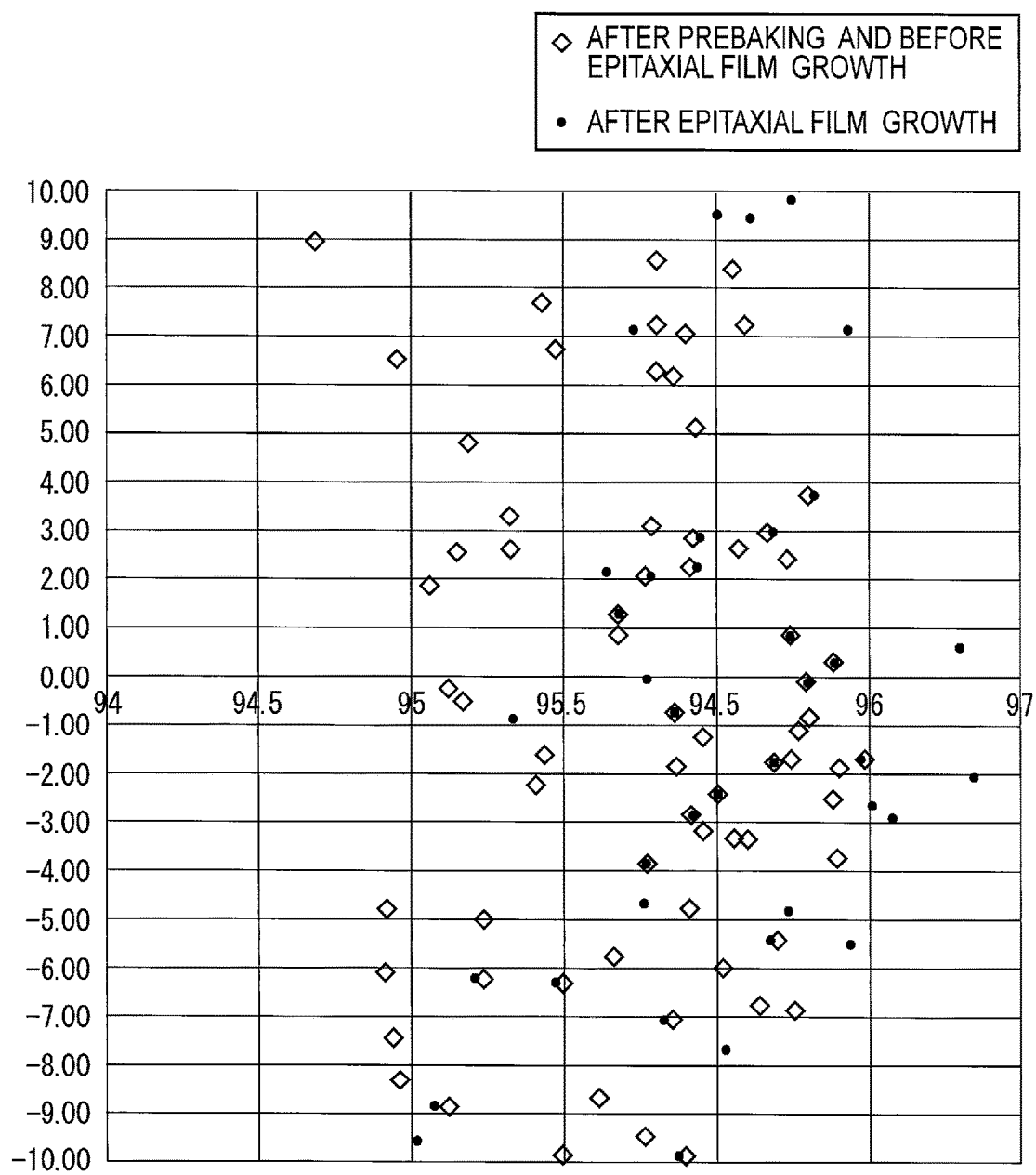
FIG. 8 shows the results of Experiment 3, which shows a part of FIG. 7 in an enlarged manner.
Figure 9:
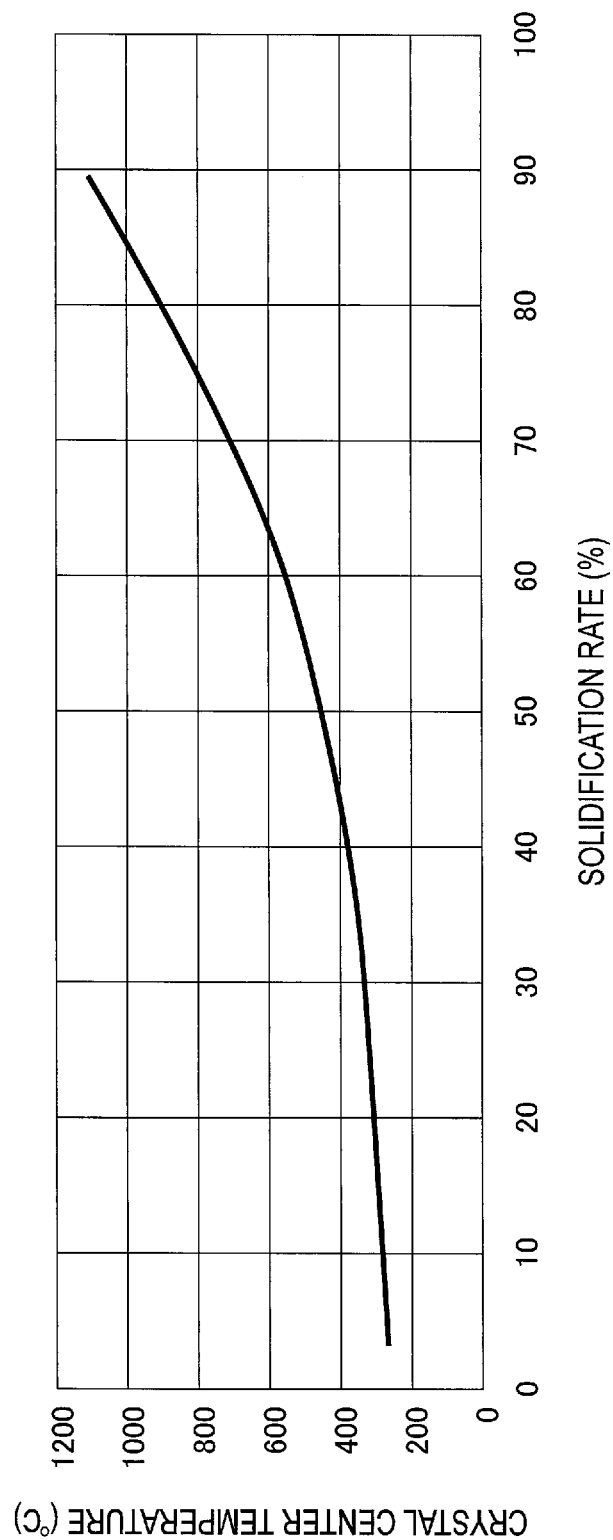
FIG. 9 is a graph showing results of Experiment 4 for deriving the manufacturing condition, which shows a relationship between the solidification rate and a center temperature of the crystal.
Figure 10:
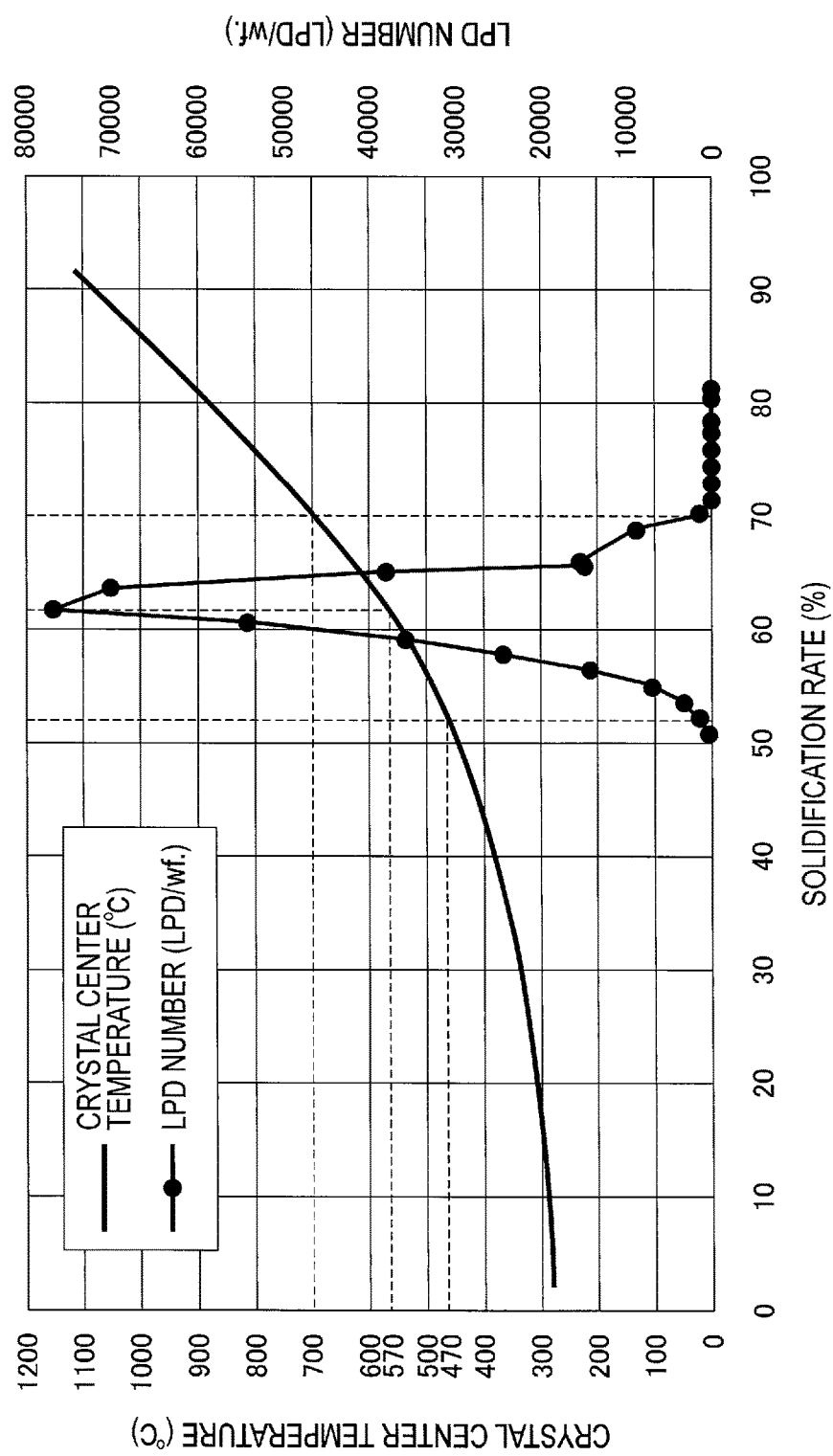
FIG. 10 is another graph showing the results of Experiment 4, which shows a relationship between the solidification rate, the center temperature of the crystal, and the LPD number in the single crystal.
Figure 11:
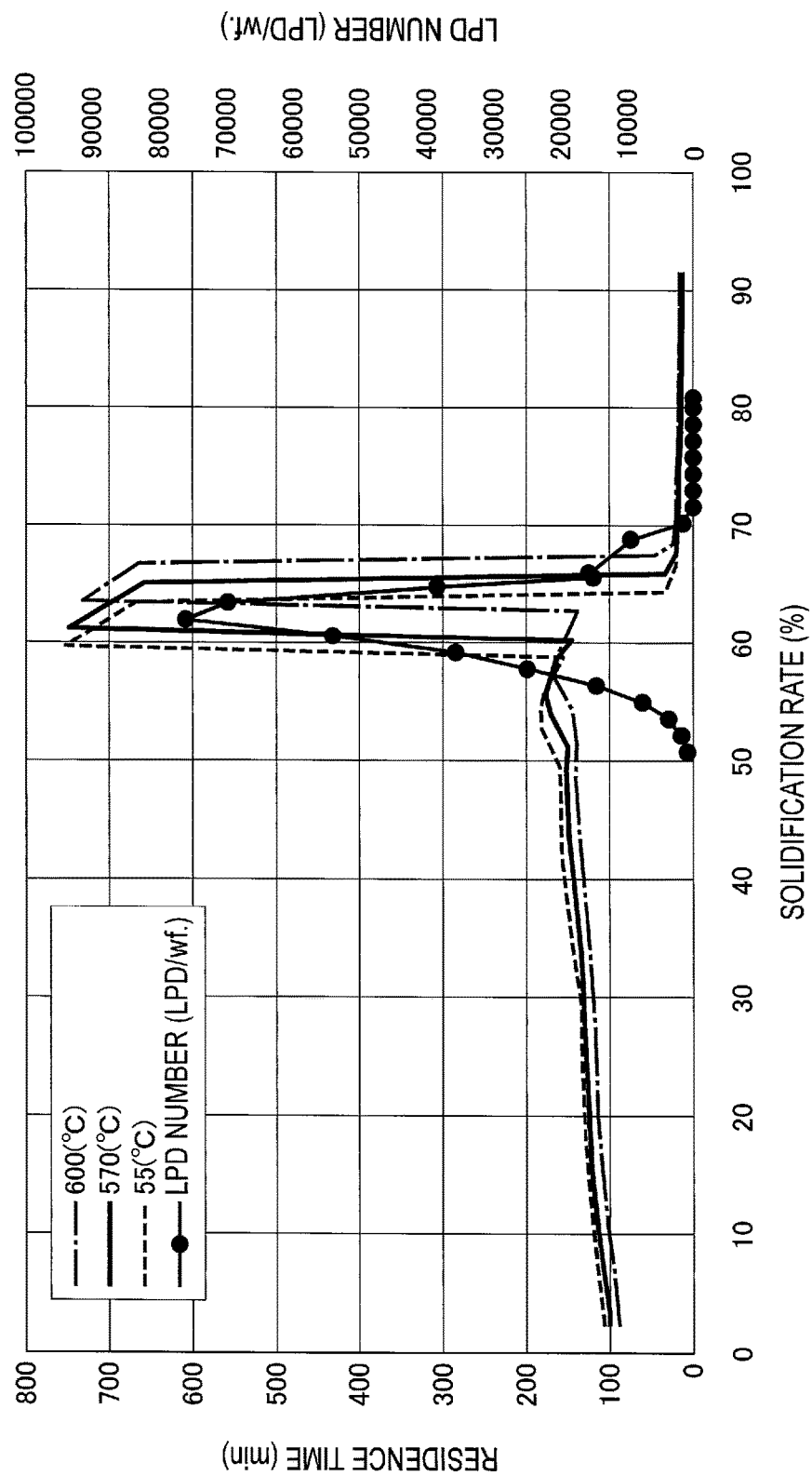
FIG. 11 is a further graph showing results of Experiment 4, which shows a relationship between the solidification rate, a residence time at each of temperatures, and the LPD number when a temperature width is ±30 degrees C.
Figure 12:
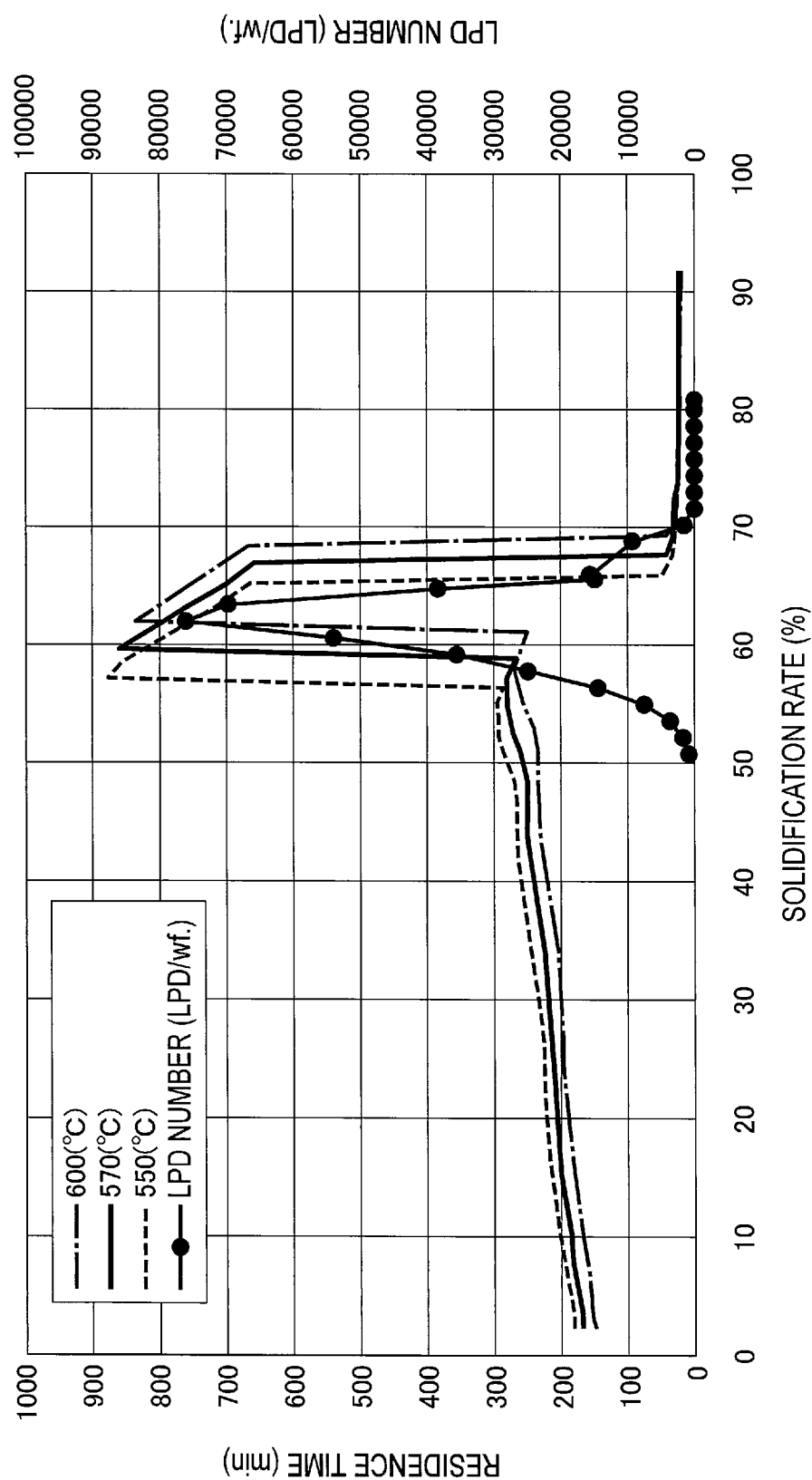
FIG. 12 is a still further graph showing results of Experiment 4, which shows a relationship between the solidification rate, a residence time at each of temperatures, and the LPD number when the temperature width is ±50 degrees C.
Figure 13:
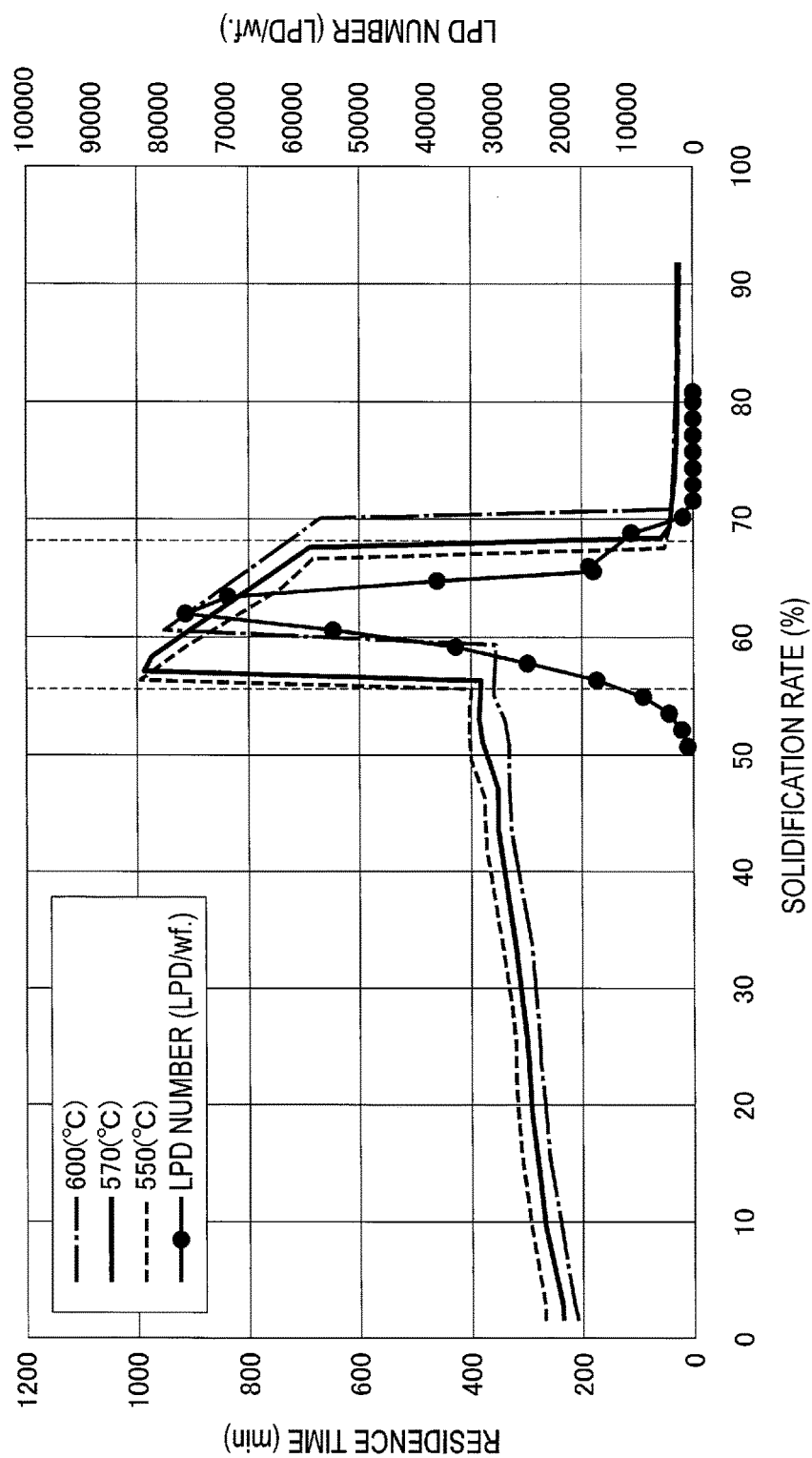
FIG. 13 is a still further graph showing results of Experiment 4, which shows a relationship between the solidification rate, a residence time at each of temperatures, and the LPD number when the temperature width is ±70 degrees C.
Figure 16:
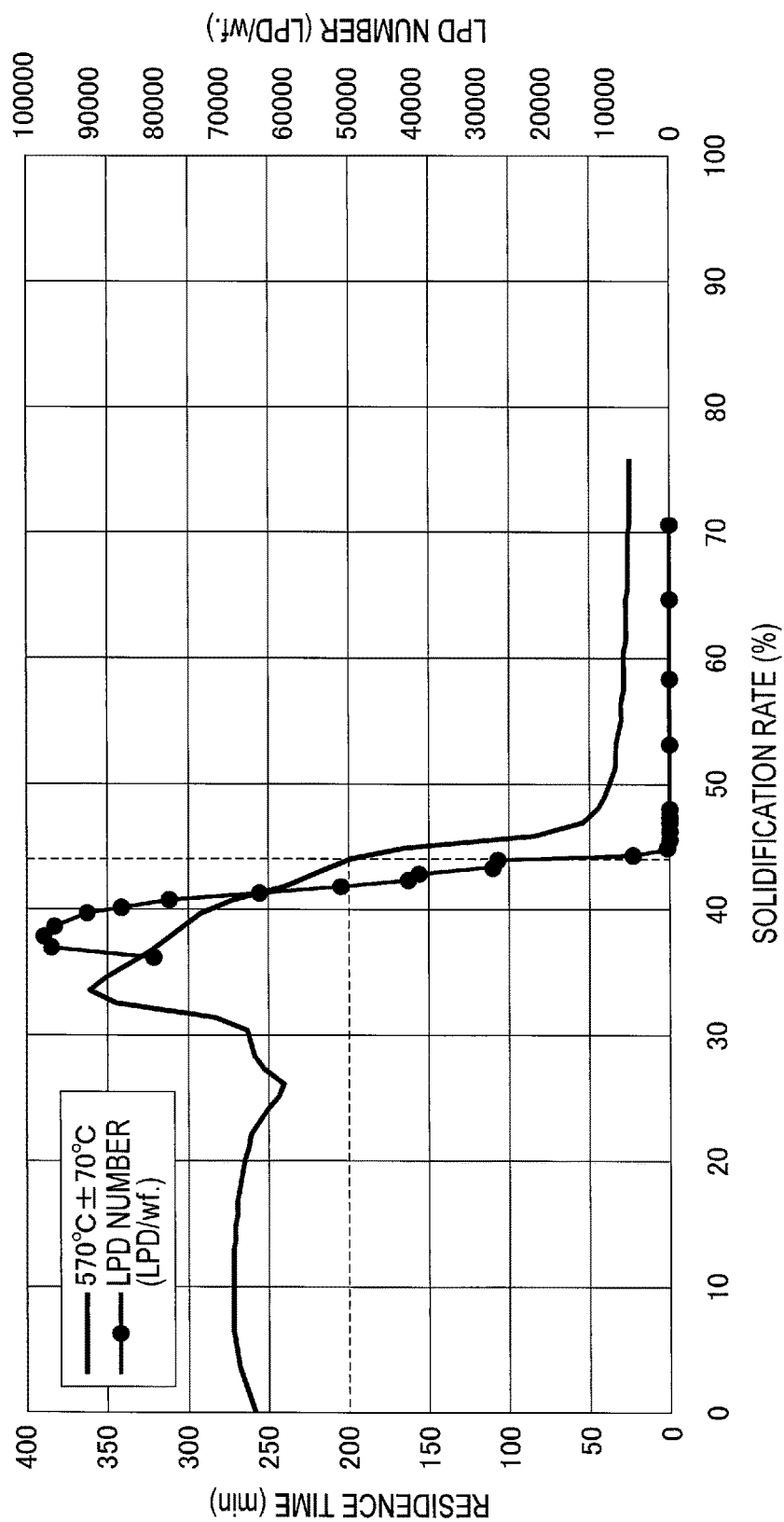
FIG. 16 is a graph showing results of an experiment performed for verifying the results of Experiment 4, which shows a relationship between the solidification rate, the residence time at each of the temperatures, and the LPD number.

The pull-up process of the seed crystal includes neck-formation step, a shoulder-formation step, a straight-body-formation step, a tail-formation step and a cooling step, The controller controls a pull-up time at least during the straight-body-formation step to be shorter than that in a conventional process to manufacture a 31 kg single crystal 6 of which dimension is shorter than a conventional single crystal. The above condition is for setting the period in which the temperature of the single crystal 6 is at 570±70 degrees C. for 20 to 200 minutes, where a thermal hysteresis of the entire single crystal 6 falls in a range at which the solidification rate exceeds approximately 44% in FIG. 16 (i.e. the area encircled by a chain double-dashed line in FIG. 2).

It should be noted that the conditions other than the pull-up time (e.g. the heating condition by the heater 32) may be the same as the conventional ones.

Specifically, when a single crystal of a typical dimension is manufactured, before the start of the cooling step after completing the tail-formation step in the cooling step, the lower end of the single crystal (the portion in FIG. 2, at which the solidification rate exceeds 60%) remains at a temperature higher than 570±70 degrees C. and is rapidly cooled from the heated state, so that it is speculated that the period in which the temperature is 570±70 degrees C. becomes short (i.e. shorter than 200 minutes). On the other hand, the upper end of the single crystal (the portion in FIG. 2, at which the solidification rate is less than 60%) is already cooled at the start of the cooling step to a temperature lower than 570±70 degrees C. Accordingly, even when the single crystal is rapidly cooled from this state, it is believed that the period at which the temperature of the upper end is 570±70 degrees C. becomes longer than that of the lower end (i.e. exceeds 200 minutes). As a result, it is speculated that a large number of SF are generated at the upper end, whereas the generation of SF is restrained at the lower end.

In contrast, in the manufacturing method according to the exemplary embodiment as shown in FIG. 18, it is speculated that, since the single crystal 6 that is shorter than the typical one is manufactured, the entire single crystal 6 can be set at a temperature higher than 570±70 degrees C. at the start of the cooling step after completion of the tail-formation step, so that the single crystal 6 at such a high temperature is rapidly cooled, thereby making the period at the temperature of 570±70 degrees C. can be set short in a manner similar to that for a lower end of a typical single crystal.

Figure 14:
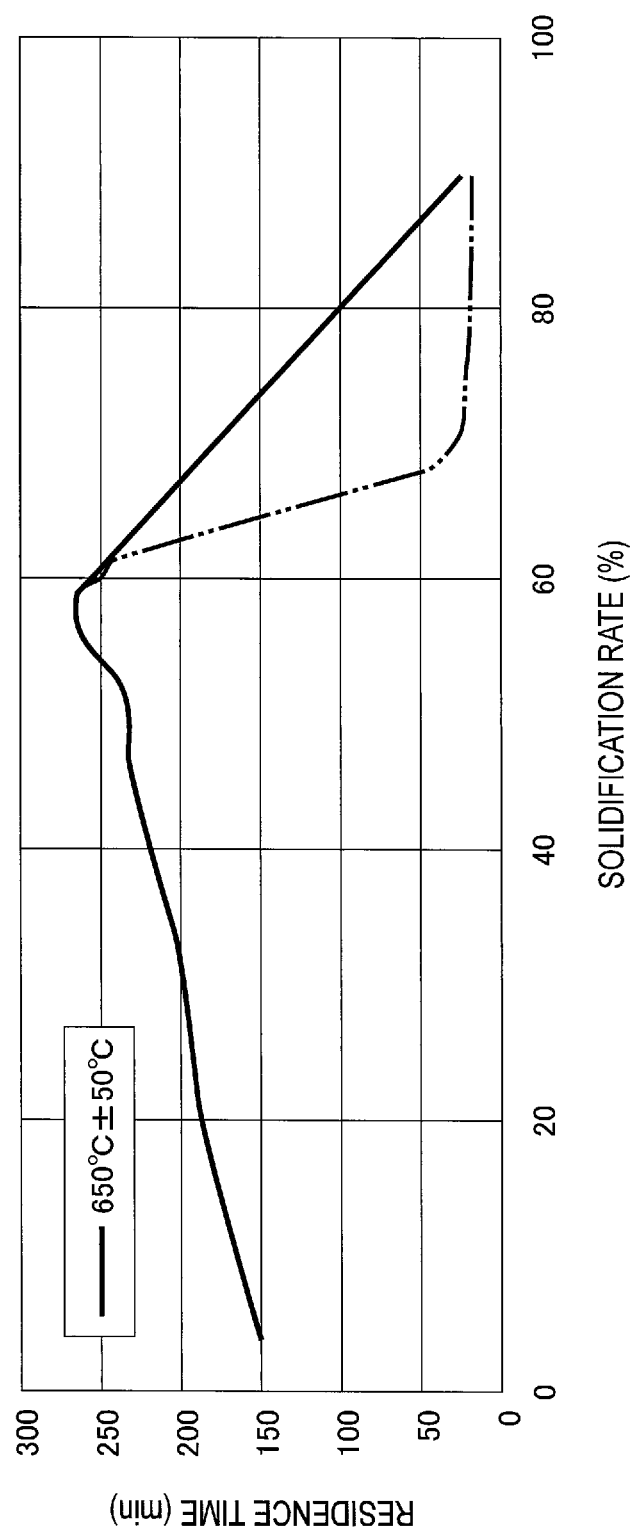
FIG. 14 is a still further graph showing results of Experiment 4, which shows a relationship between the solidification rate and the residence time of the single crystal.
Figure 15:
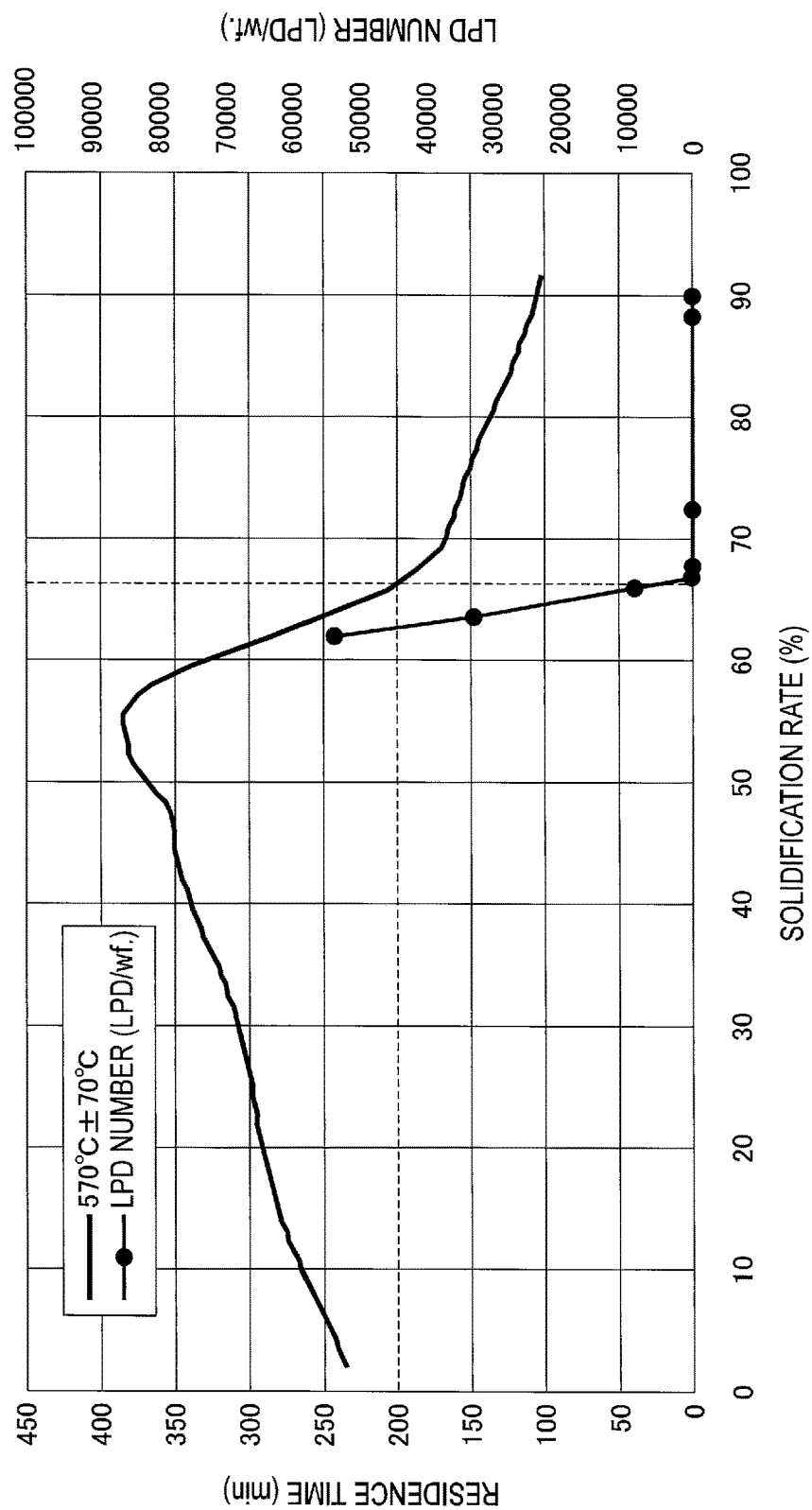
FIG. 15 is a still further graph showing results of Experiment 4, which shows a relationship between the solidification rate, the residence time at each of the temperatures, and the LPD number.

Consequently, it is speculated that the thermal hysteresis of the entire single crystal 6 falls in the range encircled by the chain double-dashed lines in FIG. 14 as described above, whereby the period for the temperature of the single crystal 6 to be at 570±70 degrees C. is in the range from 20 minutes to 200 minutes. Accordingly, the generation of LPD can be restrained over the entire length of the single crystal.

After the completion of the manufacture of one of the single crystals 6, the single-crystal pull-up apparatus 1 charges the material 411 (silicon, red phosphorus (and germanium)) for producing 31 kg of the dopant-added melt 41 into the quartz crucible 311 as shown in FIG. 18 to manufacture the next one of 31 kg of the single crystal 6.

It is preferable that the controller of the single-crystal pull-up apparatus 1 sets the furnace pressure in a range from 13.3 kPa (100 torr) to 60 kPa (450 torr) while the single crystal(s) 6 other than the lastly manufactured single crystal(s) 6 is cooled before the lastly manufactured single crystal 6 is taken out (i.e. during the cooling step). When the furnace pressure is less than 13.3 kPa, the red phosphorus (volatile dopant) is evaporated to raise the resistivity of the single crystal 6 to be subsequently manufactured. On the other hand, when the furnace pressure exceeds 60 kPa, the evaporant is likely to be adhered in the chamber 30, so that the monocrystalization for manufacturing the single crystal 6 is hampered.

Resistivity of a silicon wafer obtained from thus manufactured single crystal 6 is in a range from 0.7 mΩ·cm to 0.9 mΩ·cm. Further, the oxygen concentration of the silicon wafer is in a range from $7 \times 10^{17}$ to $10 \times 10^{17}$ atoms/cm$^3$ (according to IGFA (Inert Gas Fusion Analysis)). The concentration of red phosphorus is in a range from $8.0 \times 10^{19}$ to $1.1 \times 10^{20}$ atoms/cm$^3$. The concentration of germanium is in a range from $3.0 \times 10^{19}$ to $3.0 \times 10^{20}$ atoms/cm$^3$.

Further, when the silicon wafer is heated for 30 seconds or more in a hydrogen atmosphere at 1200 degrees C., the LPD (of 90 nm or more) number on the surface of the silicon wafer measured by DCN mode of SP-1 manufactured by KLA-Tencor Corporation is 0.1/cm$^2$ or less. In other words, the number of pit(s) generated on the surface of the silicon wafer is 0.1/cm$^2$ or less.

Manufacturing Method of Epitaxial Silicon Wafer

Next, a method for manufacturing an epitaxial silicon wafer from the single crystal 6 manufactured according to the manufacturing method as described above will be described below.

Initially, after cutting a silicon crystal plate from the single crystal 6 (first step), the silicon wafer is subjected to a prebaking treatment in order to anneal out oxygen from a surface layer of the silicon wafer (second step).

The prebaking treatment is preferably performed in a hydrogen atmosphere at a temperature from 1150 to 1200 degrees C. for a prebaking period of 30 seconds or more (e.g. 30 seconds at the shortest).

After the prebaking treatment, an epitaxial film is formed on the silicon wafer through CVD (third step). The process temperature during the epitaxial growth is in a range from 1000 to 1150 degrees C., preferably in a range from 1050 to 1080 degrees C.

Through the above manufacturing process, an epitaxial silicon wafer that exhibits extremely low resistivity of 0.7 mΩ·cm to 0.9 mΩ·cm, has extremely small number of misfit dislocation in the epitaxial film, and has LPD number resulting from the SF (stacking fault) of 0.1/cm$^2$ or less, which is sufficiently practicable as a power MOS transistor, can be manufactured.

Such a high-quality epitaxial silicon wafer that exhibits extremely low resistivity of the silicon wafer and extremely small number of LPD resulting from the SF (stacking fault) cannot be manufactured in a known manufacturing method, but can only be manufactured according to the manufacturing method of the above-described invention and thus is new.

Modifications

It should be understood that the scope of the invention is not limited to the above-described exemplary embodiment(s) but various improvements and design alterations are possible as long as such improvements and alterations are compatible with the invention.

For instance, instead of the multi-pull-up method as shown in FIG. 18, a so-called single-charge pull-up method may be employed in order to manufacture the single crystal 6, where a single-crystal pull-up apparatus 1 as shown in FIG. 19 is used. A dopant-added melt 41 for a plurality of single crystals are charged at one time in a shared quartz crucible 311, and a plurality of single crystals 6 are pulled up one by one.

When two single crystals 6 are to be manufactured, it is preferable that the controller of the single-crystal pull-up apparatus 1 sets the furnace pressure in a range from 13.3 kPa to 60 kPa after the first one of the single crystals 6 is cooled after being pulled up and before being taken out (i.e. during the cooling step). The reason for the preferability of the adjustment of the furnace pressure is the same as that in the multi-pull-up method in the above exemplary embodiment.

It should be noted that, even when the multi-pull-up method is performed, the above single-charge pull-up method is applicable without adding material(s) in pull-up the last single crystal.

For instance, 157 kg of the dopant-added melt 41 may be charged at an initial stage and 31 kg of single crystals 6 may be pulled up for five consecutive times. Also in the above arrangement, the period for the temperature of the single crystal 6 to be 570±70 degrees C. can be set in a range from 20 to 200 minutes.

When a long single crystal is to be pulled up or when the residence time at the temperature in the range of 570±70 degrees C. exceeds 200 minutes even though a short single crystal is to be pulled up, a cooler may be disposed at an upper side of the single crystal to promote the cooling of a predetermined portion of the crystal, thereby adjusting the residence time in the range of 570±70 degrees C. to be in the range from 20 to 200 minutes.

Figure 20:
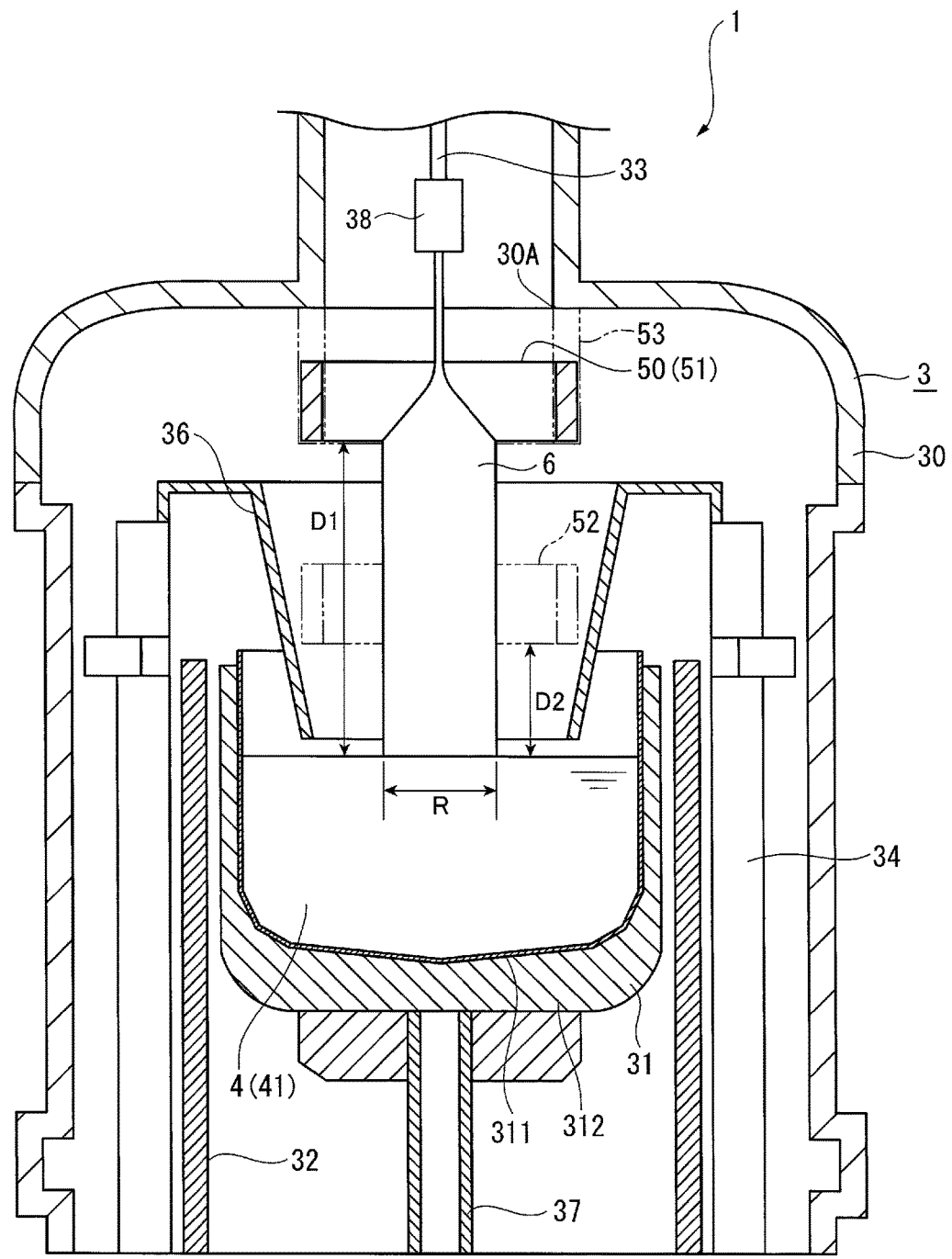
FIG. 20 is a schematic illustration showing an outline of a single-crystal pull-up apparatus provided with a cooler (a water-cooled body at a different location) or a heater (afterheater) according to a second modification of the invention.

The above cooler may be disposed as, for instance, shown in FIG. 20.

A cooler in a form of a water-cooled body 50 is disposed above the crucible 31 in the chamber 30 of the single-crystal pull-up apparatus 1. The water-cooled body 50 is preferably disposed at a position for a distance D1 as shown in a solid line in FIG. 20 from the surface of the dopant-added melt 41 to a lower end of the water-cooled body 50 to be 1.5 to 3.0 times as long as a diameter R of the single crystal 6 in order to cool a low-temperature portion of the single crystal 6 that is being pulled up.

Next, the function of the water-cooled body 50 disposed at the above-described position will be described below.

The single crystal 6 was manufactured without disposing the water-cooled body 50 in the single-crystal pull-up apparatus 1. Then, the residence time of the single crystal for each of the solidification rates in the range of 570±70 degrees C. was examined. The results are shown in a dashed-dotted line in FIG. 21.

Figure 21:
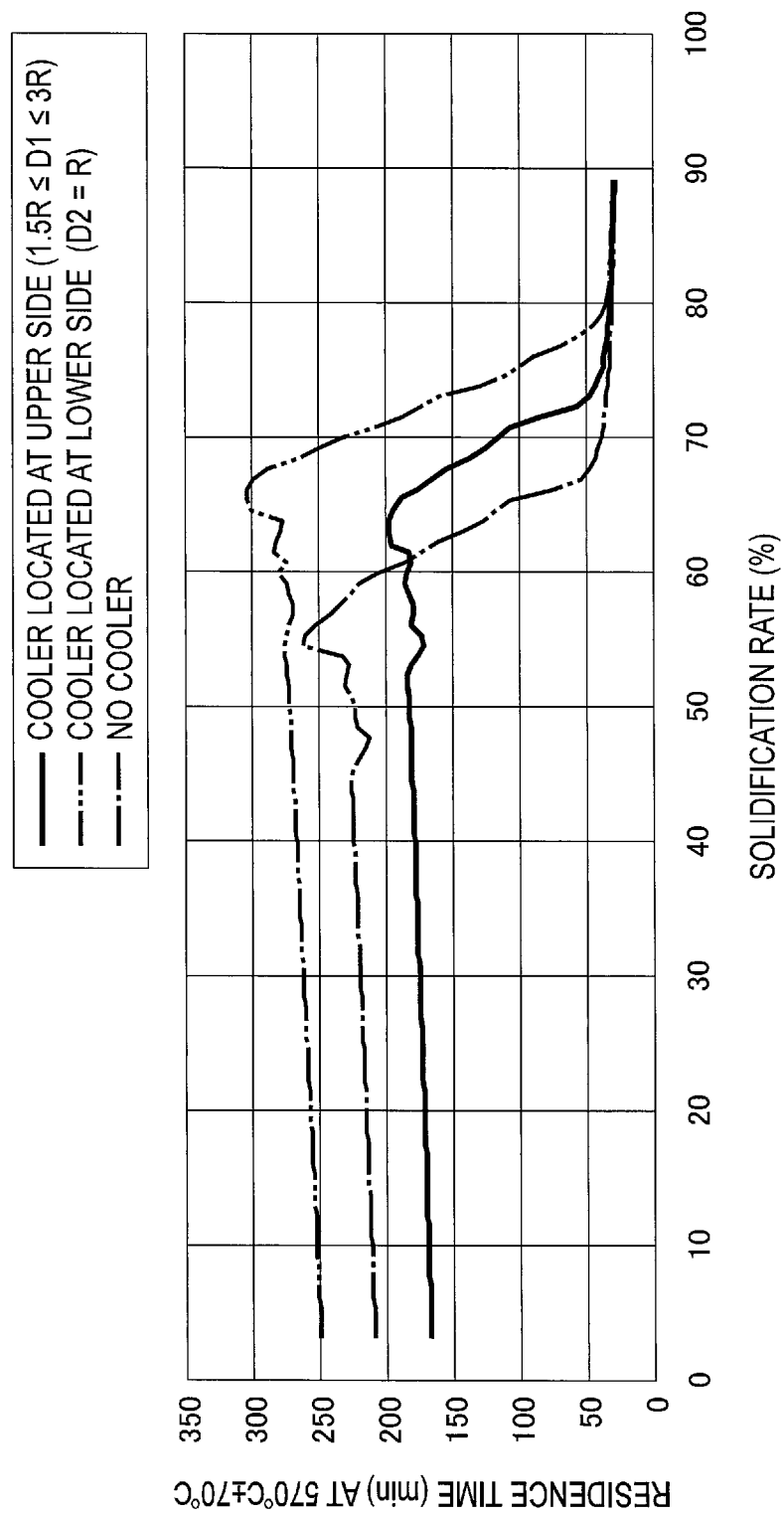
FIG. 21 is a graph showing an effect of providing the cooler (the water-cooled body at the different location) according to the second modification of the invention, which shows a relationship between the solidification rate of the single crystal and the residence time at a temperature of 570±70 degrees C.

As shown in FIG. 21, it is observed that the residence time in the range of 570±70 degrees C. is 200 minutes or more in more than half of the entire length of the single crystal 6.

Further, as shown in a chain double-dashed lines in FIG. 20, a water-cooled body 52 similar to the water-cooled body 50 is disposed at a position where a distance D2 from the surface of the dopant-added melt 41 to a lower end of the water-cooled body 52 becomes equal to the diameter R of the single crystal 6. Then, except that the single crystal 6 was cooled by the water-cooled body 52 in the straight-body-formation step for forming the straight body of the single crystal 6, the single crystal 6 was manufactured under the same conditions as an instance in which the water-cooled body 50 was not disposed, and the residence time in the range of 570±70 degrees C. was examined for each of the solidification rates. The results are shown in a chain double-dashed line in FIG. 21.

As shown in FIG. 21, it was observed that the residence time in the range of 570±70 degrees C. was 200 minutes or more in most of the length of the single crystal 6.

Further, except that the water-cooled body 50 was disposed as shown in a solid line in FIG. 20, the single crystal 6 was manufactured under the same conditions as an instance in which the water-cooled body 52 was disposed (i.e. while cooling the single crystal 6 with the water-cooled body 50 in the straight-body-formation step), and the residence time in the range of 570±70 degrees C. was examined for each of the solidification rates. The results are shown in a solid line in FIG. 21.

As shown in FIG. 21, it was observed that the residence time in the range of 570±70 degrees C. was 200 minutes or more in the entire length of the single crystal 6.

Accordingly, the single crystal 6 is cooled by the water-cooled body 50 disposed at the position where the distance D1 is 1.5 to 3.0 times as long as the diameter R of the single crystal 6, so that the length of the portion in the temperature range of 570±70 degrees C. for more than 200 minutes can be reduced (i.e. the portion in the temperature range of 570±70 degrees C. for 20 to 200 minutes can be lengthened), thereby increasing the section in which the number of pits generated on the silicon wafer is $0.1/cm^2$ or less. By thus disposing the cooler, the period for the temperature of the single crystal 6 to be 570±70 degrees C. can be controlled.

Though the cooler in a form of the cylindrical water-cooled body 50 is exemplified for explanation of the effect, the cooler may alternatively be a draw tube 53 extending downward from the chamber 30 as shown in chain double-dashed lines in FIG. 20.

Alternatively, a heater in a form of an afterheater 51 as shown in a solid line in FIG. 20 may be provided in place of the water-cooled body 50. The afterheater 51 may be, for instance, a cylindrical member in the same manner as the water-cooled body 50. The afterheater 51 is preferably disposed at a position for the distance D1 from the surface of the dopant-added melt 41 to a lower end of the afterheater 51 to be 1.5 to 3.0 times as long as the diameter R of the single crystal 6. When the afterheater 51 is disposed at the position for the distance D1 to be less than 1.5 times of the diameter R of the single crystal 6, since the afterheater 51 is located close to the surface of the dopant-added melt 41, the temperature gradient near a solid-liquid interface becomes moderate, so that dislocation is likely to occur due to compositional supercooling and the like.

Next, the function of the afterheater 51 disposed at the above described position will be described below.

The single crystal 6 was manufactured without disposing the afterheater 51 in the single-crystal pull-up apparatus 1 (i.e. under the condition similar to those in Experiment 1). Then, the temperature distribution at the center of the single crystal for each of the solidification rates when the tail was separated from the dopant-added melt 41 was examined. The results are shown in a dashed-dotted line in FIG. 22A. Further, the residence time of the single crystal for each of the solidification rates in the range of 570±70 degrees C. was examined. The results are shown in a dashed-dotted line in FIG. 22B.

Further, except that the afterheater 51 was disposed at the position shown in a solid line in FIG. 20, the single crystal 6 was manufactured under the same conditions as those in the above Experiment 1 (i.e. while heating the single crystal 6 with the aftercooler 51 in the straight-body-formation step to restrain the temperature reduction of the single crystal 6), and the temperature distribution at the center of the single crystal and the residence time in the range of 570±70 degrees C. were examined for each of the solidification rates. The results are shown in solid lines in FIG. 22A (and FIG. 22B).

Figure 22B:
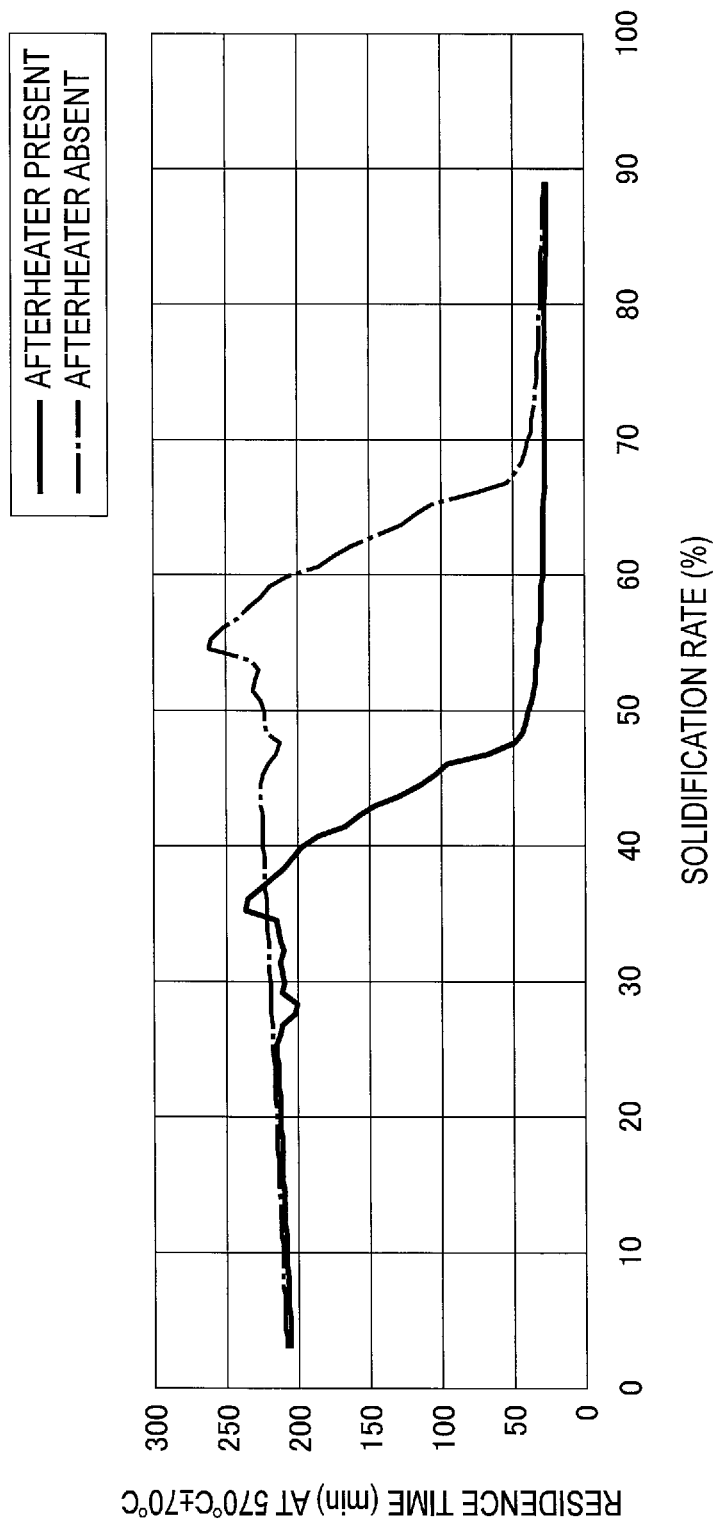
FIG. 22B is a graph showing an effect of providing the heater (the afterheater) according to the second modification of the invention, which shows a relationship between the solidification rate of the single crystal and the residence time at the temperature of 570±70 degrees C.

As shown in FIG. 22A, when the afterheater 51 is present, it is found the portion at which the temperature becomes 640 degrees C. (i.e. 570+70 degrees C.) or more after the tail formation step becomes longer than an instance in which the afterheater 51 is not provided. Accordingly, with the above arrangement where the portion whose temperature is 640 degrees C. or more is rapidly cooled with the afterheater 51 being powered off in the cooling step after the straight-body-formation step with the afterheater 51 being powered on in the tail-formation step, the portion at the temperature ranging from 570±70 degrees C. for the period of 20 to 200 minutes (i.e. the portion at which the number of pits generated on the silicon wafer is $0.1/cm^2$ or less) can be increased. In fact, as shown in FIG. 22B, it is observed that the portion subjected to the temperature ranging from 570±70 degrees C. for 20 to 200 minutes can be considerably increased with the use of the afterheater 51.

EXAMPLE(S)

Next, the invention will be described below in detail with reference to Example(s) and Comparative(s). It should be noted, however, the scope of the invention is by no means limited by the Example(s) and Comparative(s).

The single crystal 6 was manufactured using the single-crystal pull-up apparatus 1 shown in FIG. 19 with an single-charge pull-up method in which the dopant-added melt 41 for two single crystals were charged at one time and two single crystals 6 with 200 mm diameter were pulled up one by one.

Specifically, 82 kg of the polysilicon material was charged in the quartz crucible 311 and was heated to be melted. Subsequently, red phosphorus (volatile dopant) was added in the silicon melt 4 to generate the dopant-added melt 41 while the gas flow rate and furnace pressure in the chamber 30 were set at predetermined values. The additive amount of red phosphorus was set so that resistivity of silicon wafer(s) cut out from the single crystal 6 was in a range from 0.7 mΩ·cm to 0.9 mΩ·cm.

Then, 40 kg of the single crystals 6 was pulled up for two consecutive times. In the pull-up step including a neck-formation step, a shoulder-formation step, a straight-body-formation step, a tail-formation step and a cooling step, a pull-up time at least during the straight-body-formation step was set to be shorter than a conventional pull-up time to manufacture a 40 kg single crystal 6 of which dimension was shorter than a conventional single crystal. When two single crystals 6 are to be manufactured, the furnace pressure was set in a range from 13.3 kPa to 60 kPa after first one of the single crystals 6 was pulled up and was cooled before being taken out (i.e. during the cooling step).

The resistivity of silicon wafers cut out from portions of the manufactured two single crystals 6 with a predetermined solidification rate was measured.

Figure 23:
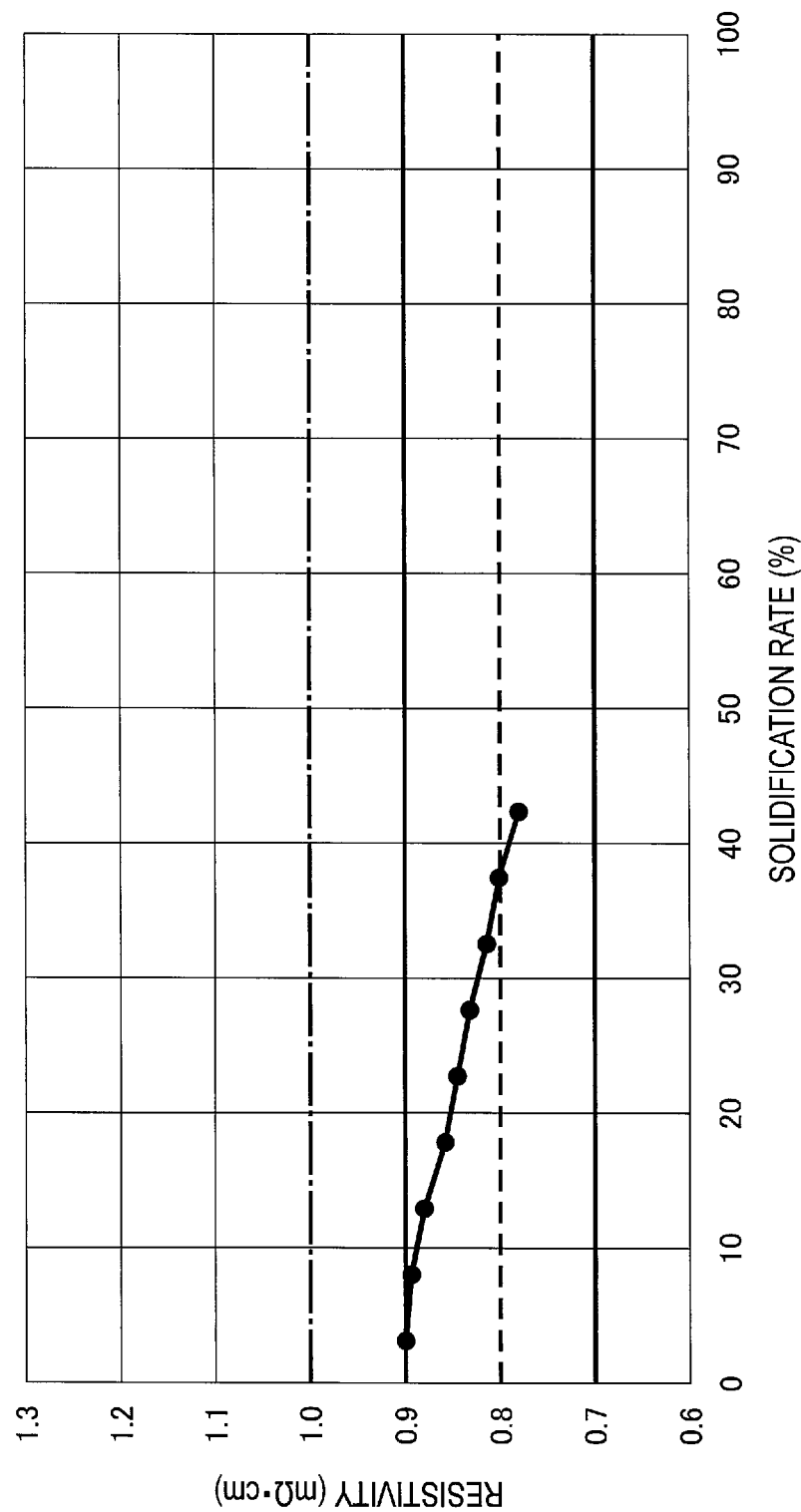
FIG. 23 is a graph showing a resistivity distribution of a first one of single crystals according to Examples of the invention.
Figure 24:
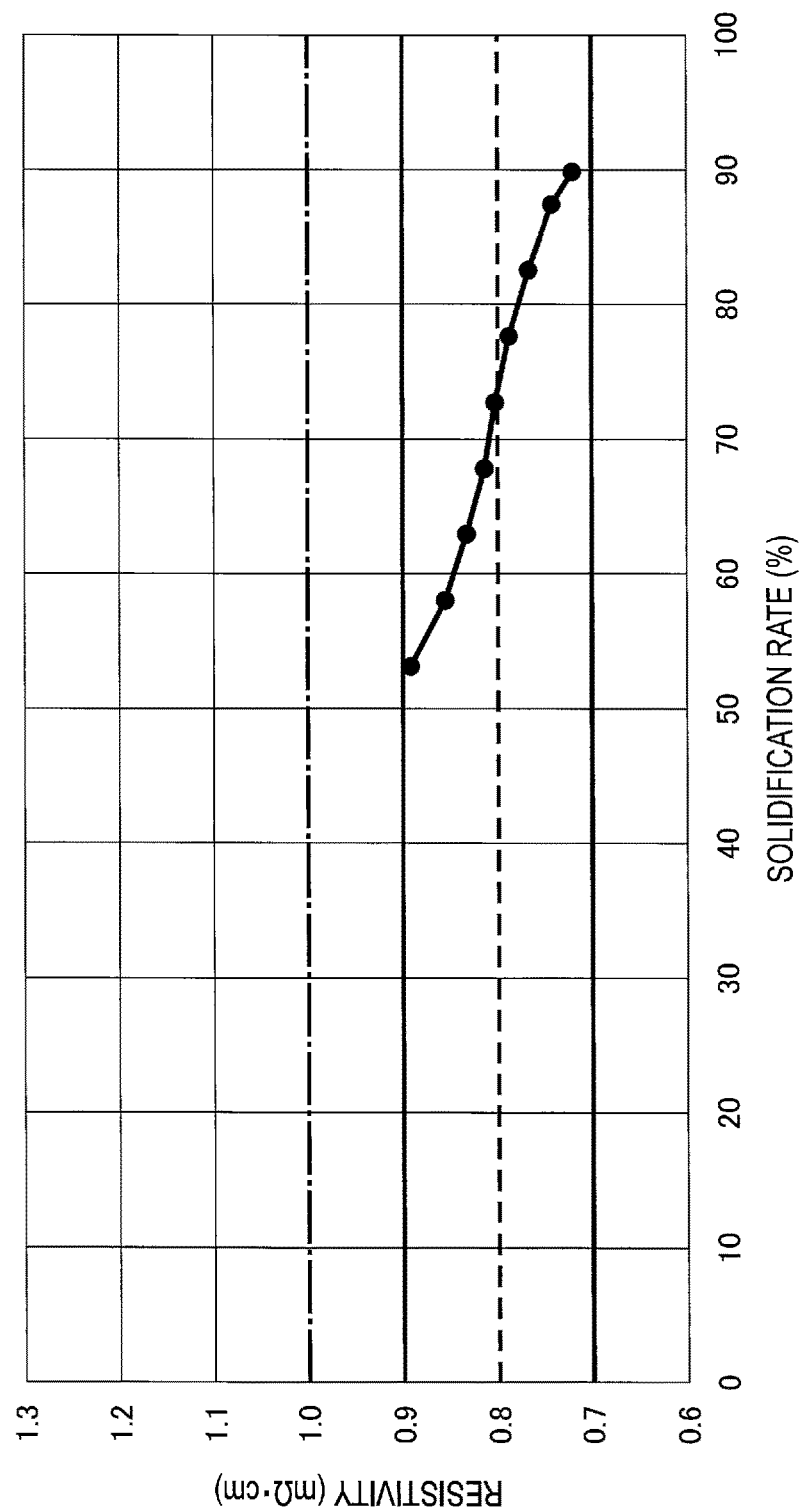
FIG. 24 is a graph showing a resistivity distribution of a second one of the single crystals according to Examples of the invention.

The resistivity distribution of the first one of the single crystals 6 is shown in FIG. 23, and the resistivity distribution of the second one of the single crystals 6 is shown in FIG. 24.

Figure 25:
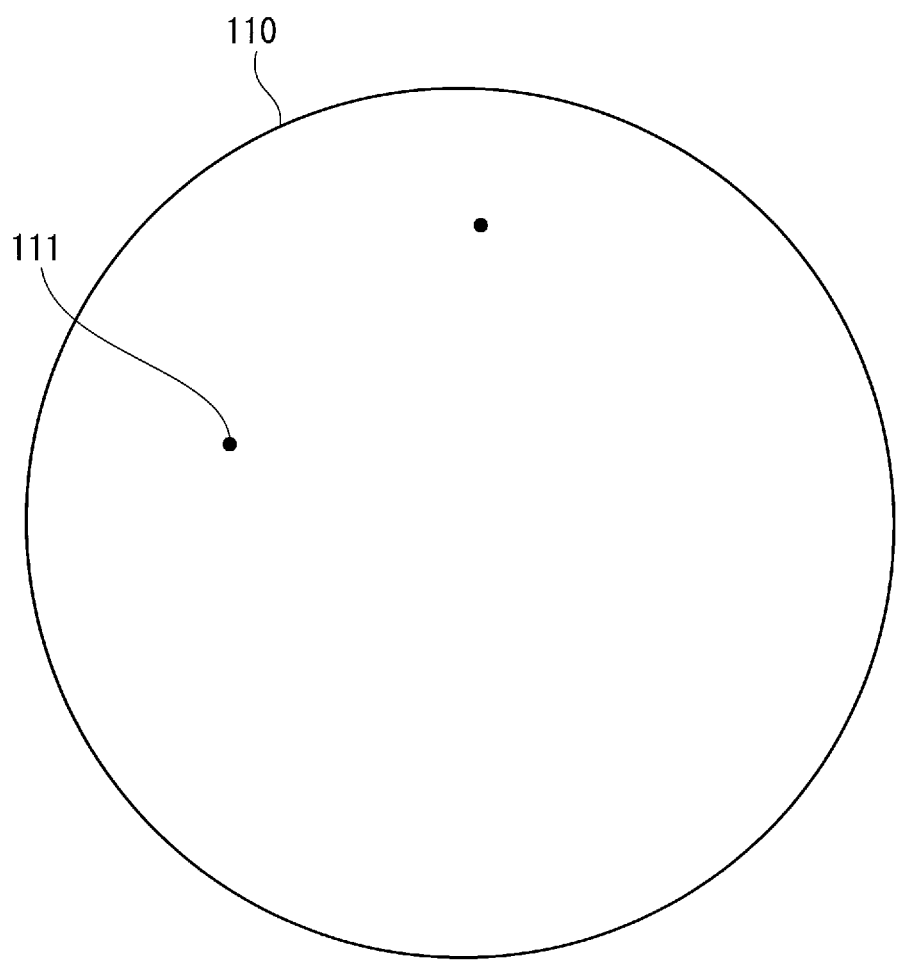
FIG. 25 illustrates LPD generated on an epitaxial silicon wafer manufactured using the single crystals according to Examples of the invention.

As shown in FIGS. 23 and 24, it is observed that the resistivity of the first one of the single crystals 6 and the second one of the single crystals 6 is in a range from 0.7 mΩ·cm to 0.9 mΩ cm. It is speculated that the period for the two single crystals 6 to be in the range of 570±70 degrees C. was from 20 to 200 minutes. Then, using the silicon wafers cut out from the single crystals 6, epitaxial silicon wafers were manufactured according to the same process as described in the exemplary embodiment. It is found as shown in FIG. 25 that epitaxial silicon wafers 110 in which the number of LPD 111 originated from the SF is 0.1/cm² or less can be obtained.

The invention claimed is:

1. A manufacturing method of a single crystal using a single-crystal pull-up apparatus comprising a chamber, a crucible disposed in the chamber and adapted to receive a dopant-added melt in which red phosphorus is added to a silicon melt, and a pull-up portion that is configured to pull up a seed crystal after the seed crystal is brought into contact with the dopant-added melt, the method comprising:
adding the red phosphorus to the silicon melt so that a resistivity of the single crystal falls in a range from 0.7 mΩ·cm to 0.9 mΩ·cm; and
pulling-up the single crystal in an inert gas atmosphere while appropriately controlling a temperature of at least a part of a region of a straight body of the single crystal included in a region of the single crystal at which a solidification rate of the single crystal is from 3% to 89% to be in a range of 570±70 degrees C. for a period of 20 to 200 minutes, so that the number of pits of 90 nm or greater, which are originated from clusters of oxygen and phosphorus, generated on a surface of an evaluation silicon wafer sliced from the region of the single crystal for which the temperature was controlled to be in a range of 570±70 degrees C. for a period of 20 to 200 minutes becomes 0.1/cm² or less after subjecting the evaluation silicon wafer to a heat treatment in which the evaluation silicon wafer is heated at 1200 degrees C. for 30 seconds in a hydrogen atmosphere.

2. The manufacturing method of the single crystal according to claim 1, further comprising:
disposing a cooler above the crucible in the chamber; and
cooling the single crystal with the cooler during the formation of the region of the single crystal, thereby appropriately controlling the period that the temperature of the region of the single crystal is in the range of 570±70 degrees C.

3. The manufacturing method of the single crystal according to claim 1, further comprising:
disposing a heater above the crucible in the chamber;
heating the single crystal with the heater during the formation of the region of the single crystal to restrain a decrease in the temperature of the single crystal; and
cooling the single crystal after a tail-formation step for forming a tail of the single crystal, thereby appropriately controlling the period that the temperature of the region of the single crystal is in the range of 570±70 degrees C.

4. A manufacturing method of an epitaxial silicon wafer, comprising:
a first step of cutting the silicon wafer from the single crystal manufactured through the manufacturing method of a single crystal according to claim 1;
a second step of heating the silicon wafer cut out in the first step in a hydrogen atmosphere; and
a third step of forming an epitaxial film on the silicon wafer after the second step to manufacture the epitaxial silicon wafer comprising the silicon wafer and the epitaxial film, the epitaxial silicon wafer comprising 0.1/cm² or less of light point defects on a surface of the epitaxial film and not comprising a polysilicon film.

5. The manufacturing method of a single crystal according to claim 1, wherein the single crystal is pulled up while appropriately controlling the temperature of the at least a part of the straight body of the single crystal included in the region of the single crystal at which a solidification rate is from 3% to 60% to be in the range of 570±70 degrees C. for the period of 20 to 200 minutes.

6. A manufacturing method of a silicon wafer using a single crystal obtained using a single-crystal pull-up apparatus comprising a chamber, a crucible disposed in the chamber and adapted to receive a dopant-added melt in which red phosphorus is added to a silicon melt, and a pull-up portion that is configured to pull up a seed crystal after the seed crystal is brought into contact with the dopant-added melt, the method comprising:
adding the red phosphorus to the silicon melt so that a resistivity of the single crystal falls in a range from 0.7 mΩ·cm to 0.9 mΩ·cm;
pulling-up the single crystal in an inert gas atmosphere; and
cutting the silicon wafer from a portion of the single crystal, a temperature of the portion being 570±70 degrees C. for 20 to 200 minutes when the single crystal is pulled up, a number of light point defects of 90 nm or greater, which are originated from clusters of oxygen and phosphorus, generated on a surface of an evaluation silicon wafer sliced from the portion of the single crystal being 0.1/cm² or less after subjecting the evaluation silicon wafer to a heat treatment in which the evaluation silicon wafer is heated at 1200 degrees C. for 30 seconds in a hydrogen atmosphere.

7. A silicon single crystal added with red phosphorus and having a resistivity in a range from 0.7 mΩ·cm to 0.9 mΩ·cm, the silicon single crystal comprising:

a straight body pulled up at a temperature of 570±70 degrees C. for 20 to 200 minutes, the straight body comprising a crystal region in which the number of light point defects of 90 nm or greater, which are originated from clusters of oxygen and phosphorus, generated on a surface of a silicon wafer cut out from the silicon single crystal is $0.1/cm^2$ or less after applying a heat treatment for heating the silicon wafer at 1200 degrees C. for 30 seconds in a hydrogen atmosphere.

8. An epitaxial silicon wafer comprising:

a silicon wafer cut out from the straight body of the silicon single crystal according to claim 7; and an epitaxial film formed on the silicon wafer, wherein the epitaxial silicon wafer comprises $0.1/cm^2$ or less of light point defects on a surface thereof and does not comprise a polysilicon film.

* * * * *